(12) United States Patent
Kim

(10) Patent No.: US 10,860,421 B2
(45) Date of Patent: Dec. 8, 2020

(54) MEMORY SYSTEM AND OPERATION METHOD THEREOF

(71) Applicant: SK hynix Inc., Gyeonggi-do (KR)

(72) Inventor: Kyung-Bum Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/369,191

(22) Filed: Mar. 29, 2019

(65) Prior Publication Data

US 2020/0073753 A1 Mar. 5, 2020

(30) Foreign Application Priority Data

Aug. 31, 2018 (KR) ........................ 10-2018-0103737

(51) Int. Cl.
| | | |
|---|---|---|
| *G06F 11/10* | (2006.01) | |
| *G11C 29/52* | (2006.01) | |
| *G06F 3/06* | (2006.01) | |

(52) U.S. Cl.
CPC ........ G06F 11/1068 (2013.01); G06F 3/0619 (2013.01); G06F 3/0659 (2013.01); G06F 3/0679 (2013.01); G11C 29/52 (2013.01)

(58) Field of Classification Search
CPC .. G06F 11/1068; G06F 3/0679; G06F 3/0659; G06F 3/0619; G06F 11/1072; G06F 3/0614; G06F 3/0658; G11C 29/52; G11C 2029/0411; G11C 5/148; G11C 16/08; G11C 16/24; G11C 16/30
USPC .......................................................... 714/764
See application file for complete search history.

(56) References Cited

U.S. PATENT DOCUMENTS

| | | | | |
|---|---|---|---|---|
| 8,238,157 | B1 * | 8/2012 | Sommer | G11C 11/5628 |
| | | | | 365/185.03 |
| 8,566,671 | B1 * | 10/2013 | Ye | G11C 29/42 |
| | | | | 714/764 |
| 9,928,126 | B1 * | 3/2018 | Shappir | G11C 11/5642 |
| 2013/0128665 | A1 * | 5/2013 | Mokhlesi | G11C 16/04 |
| | | | | 365/185.09 |
| 2014/0340964 | A1 * | 11/2014 | Shiino | G11C 16/26 |
| | | | | 365/185.03 |
| 2015/0098271 | A1 * | 4/2015 | Lasser | G11C 7/1006 |
| | | | | 365/185.11 |

(Continued)

FOREIGN PATENT DOCUMENTS

| | | |
|---|---|---|
| KR | 10-1541736 | 8/2015 |
| KR | 10-2017-0028670 | 3/2017 |
| KR | 10-2017-0118284 | 10/2017 |

*Primary Examiner* — Albert Decady
*Assistant Examiner* — Enam Ahmed
(74) *Attorney, Agent, or Firm* — IP & T Group LLP

(57) ABSTRACT

A memory system may include: a multi-level cell memory device; and a controller suitable for controlling the memory device, wherein the controller includes a processor suitable for searching for the last programmed word line in an open memory block when the memory system is powered up after a sudden power-off, and controlling sequential read operations on data of the memory device in a plurality of logical pages corresponding to the last programmed word line, wherein the processor ends the sequential read operations depending on whether error correction on sequentially read data fails, receives from a host the error correction-failed data and data on which the sequential read operations are not performed, and controls the memory device to program the received data.

18 Claims, 18 Drawing Sheets

(56) References Cited

U.S. PATENT DOCUMENTS

2015/0254132 A1* 9/2015 Murakami .......... G06F 11/1048
714/764
2016/0011939 A1* 1/2016 Luby ................... G06F 11/1088
714/764

* cited by examiner

MEMORY SYSTEM AND OPERATION METHOD THEREOF

CROSS-REFERENCE TO RELATED APPLICATION

This application claims priority under 35 U.S.C. § 119(a) to Korean Patent Application No. 10-2018-0103737 filed on Aug. 31, 2018, which is incorporated herein by reference in its entirety.

BACKGROUND

1. Field

Various embodiments relate to a memory system, and more particularly, to a memory system including a multi-level-cell memory device and an operation method thereof.

2. Discussion of the Related Art

The computer environment paradigm has been transitioning to ubiquitous computing, which enables computing systems to be used anytime and anywhere. As a result, use of portable electronic devices such as mobile phones, digital cameras, and laptop computers has rapidly increased. These portable electronic devices generally use a memory system having one or more memory devices for storing data. A memory system may be used as a main memory device or an auxiliary memory device of a portable electronic device.

Since they have no moving parts, memory systems provide advantages such as excellent stability and durability, high information access speed, and low power consumption. Examples of memory systems having such advantages include universal serial bus (USB) memory devices, memory cards having various interfaces, and solid state drives (SSDs).

SUMMARY

Various embodiments are directed to a memory system capable of reducing the time required for a recovery operation due to a sudden power-off, and an operation method thereof.

In an embodiment, a memory system may include: a multi-level cell memory device; and a controller suitable for controlling the memory device, wherein the controller includes a processor suitable for searching for the last programmed word line in an open memory block when the memory system is powered up after a sudden power-off, and controlling sequential read operations on data of the memory device on a plurality of logical pages corresponding to the last programmed word line, wherein the processor ends the sequential read operations depending on whether error correction on sequentially read data fails, receives from a host the error correction-failed data and data on which the sequential read operations are not performed, and controls the memory device to program the received data.

In an embodiment, an operation method of a multi-level cell memory system may include: searching for the last programmed word line in an open memory block, when the memory system is powered up after a sudden power-off; performing sequential read operations on data of a memory device, which correspond to a plurality of logical pages corresponding to the last programmed word line; ending the sequential read operations on the data corresponding to the plurality of logical pages depending on whether error correction on sequentially read data fails, and receiving from a host the error correction-failed data and data on which the sequential read operations are not performed; and programming the received data to the memory device.

In an embodiment, a memory system may include: a memory device including a plurality of multi-level cells coupled between a plurality of word lines and a plurality of bit lines; and a controller suitable for: searching for a last programmed word line among the plurality of word lines when the memory system is powered up after a sudden power-off, the last programmed word line corresponding to a plurality of logical pages; performing a recovering operation for a first logical page among the plurality of logical pages; when the recovering of the first logical page failed, ending a recovering operation for a second logical page; and when the recovering of the first logical page succeeded, performing a sequential recovering operation for remaining logical pages including the second logical page, among the plurality of logical pages.

DETAILED DESCRIPTION

Various embodiments will be described in detail with reference to the accompanying drawings. The following description is focused on aspects and features in accordance with the present embodiments; description of well-known technical material is omitted in order not to unnecessarily obscure the subject matter of the present embodiments.

Throughout the specification, reference to "an embodiment," "another embodiment" or the like is not necessarily to only one embodiment, and different references to any such phrase are not necessarily to the same embodiment(s).

Figure 1:
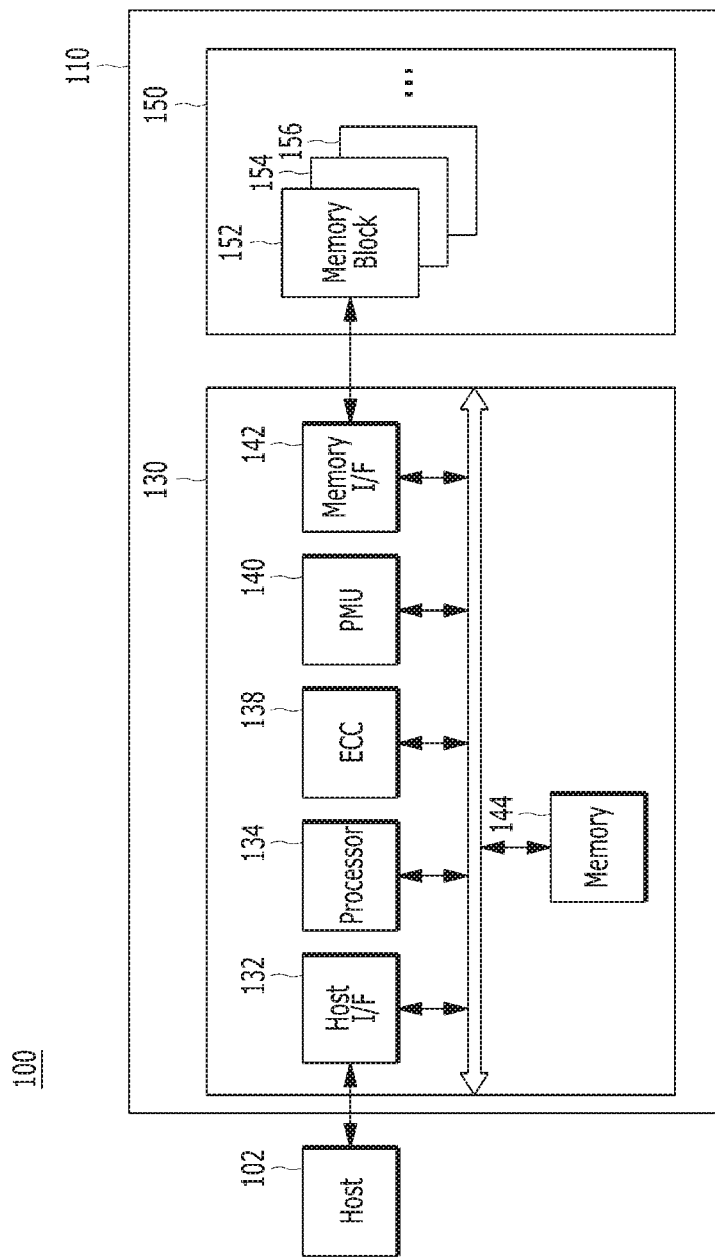
FIG. 1 is a block diagram illustrating a data processing system including a memory system in accordance with an embodiment of the present invention.

FIG. 1 is a block diagram illustrating a data processing system 100 in accordance with an embodiment of the present invention.

Referring to FIG. 1, the data processing system 100 may include a host 102 operatively coupled to a memory system 110.

The host 102 may include any of various portable electronic devices such as a mobile phone, an MP3 player and a laptop computer, or any of various non-portable electronic devices such as a desktop computer, a game machine, a television (TV), and a projector.

The host 102 may include at least one operating system (OS), which may manage and control overall functions and operations of the host 102, and provide operation between the host 102 and a user using the data processing system 100 or the memory system 110. The OS may support functions and operations corresponding to the use purpose and usage of a user. The OS may be divided into a general OS and a mobile OS, depending on the mobility of the host 102. The general OS may be divided into a personal OS and an enterprise OS, depending on the environment of a user. For example, the personal OS configured to support a function of providing a service to general users may include Windows and Chrome, and the enterprise OS configured to secure and support high performance may include Windows server, Linux and Unix, The mobile OS configured to support a function of providing a mobile service to users and a power saving function of a system may include Android, iOS and Windows Mobile. The host 102 may include a plurality of OSs, and execute an OS to perform an operation corresponding to a user's request on the memory system 110.

The memory system 110 may operate to store data for the host 102 in response to a request of the host 102. Non-limiting examples of the memory system 110 include a solid state drive (SSD), a multi-media card (MMC), a secure digital (SD) card, a universal storage bus (USB) device, a universal flash storage (UFS) device, compact flash (CF) card, a smart media card (SMC), a personal computer memory card international association (PCMCIA) card and memory stick. The MMC may include an embedded MMC (eMMC), reduced size MMC (RS-MMC) and/or micro-MMC. The SD card may include a mini-SD card and/or micro-SD card.

The memory system 110 may be embodied by any of various types of storage devices. Examples of such storage devices include, but are not limited to, volatile memory devices such as a dynamic random access memory (DRAM) and a static RAM (SRAM) and nonvolatile memory devices such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), a resistive RAM (RRAM or ReRAM) and a flash memory. The flash memory may have a 3-dimensional (3D) stack structure.

The memory system 110 may include a controller 130 and a memory device 150. The memory device 150 may store data for the host 102, and the controller 130 may control data storage into the memory device 150.

The controller 130 and the memory device 150 may be integrated into a single semiconductor device, which may be included in any of the various types of memory systems as exemplified above. For example, the controller 130 and the memory device 150 may be integrated as one semiconductor device to constitute a solid state drive (SSD). When the memory system 110 is used as an SSD, the operating speed of the host 102 connected to the memory system 110 can be improved. In another embodiment, the controller 130 and the memory device 150 may be integrated as one semiconductor device to constitute a memory card such as a personal computer memory card international association (PCMCIA) card, compact flash (CF) card, smart media (SM) card, memory stick, multimedia card (MMC) including reduced size MMC (RS-MMC) and micro-MMC, secure digital (SD) card including mini-SD, micro-SD and SDHC, or universal flash storage (UFS) device.

Non-limiting application examples of the memory system 110 include a computer, an ultra mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game machine, a navigation system, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device constituting a data center, a device capable of transmitting/receiving information in a wireless environment, one of various electronic devices constituting a home network, one of various electronic devices constituting a computer network, one of various electronic devices constituting a telematics network, a Radio Frequency Identification (RFID) device, or one of various components constituting a computing system.

The memory device 150 may be a nonvolatile memory device and may retain data stored therein even though power is not supplied. The memory device 150 may store data provided from the host 102 through a write operation, and provide data stored therein to the host 102 through a read operation. The memory device 150 may include a plurality of memory blocks 152, 154, 156 . . . , each of which may include a plurality of pages, and each of the pages may include a plurality of memory cells coupled to a word line. In an embodiment, the memory device 150 may be a flash memory. The flash memory may have a 3-dimensional (3D) stack structure.

Since the structure of the memory device 150 including its 3D stack structure will be described in detail later with reference to FIGS. 2 to 4, further description of this aspect is omitted here.

The controller 130 may control the memory device 150 in response to a request from the host 102. For example, the controller 130 may provide data read from the memory device 150 to the host 102, and store data provided from the host 102 into the memory device 150. For this operation, the controller 130 may control read, write, program and erase operations of the memory device 150.

The controller 130 may include a host interface (I/F) 132, a processor 134, an error correction code (ECC) component 138, a power management unit (PMU) 140, a memory I/F 142 such as a NAND flash controller (NFC), and a memory 144, all operatively coupled via an internal bus.

The host interface 132 may be configured to process a command and data of the host 102. The host interface 132 may communicate with the host 102 through one or more of various interface protocols such as universal serial bus (USB), multi-media card (MMC), peripheral component interconnect-express (PCI-e or PCIe), small computer system interface (SCSI), serial-attached SCSI (SAS), serial advanced technology attachment (SATA), parallel advanced technology attachment (PATA), enhanced small disk interface (ESDI) and integrated drive electronics (IDE).

The ECC component 138 may detect and correct an error contained in the data read from the memory device 150. In other words, the ECC component 138 may perform an error correction decoding process to the data read from the memory device 150 through an ECC code used during an ECC encoding process. According to a result of the error correction decoding process, the ECC component 138 may output a signal, for example, an error correction success/fail signal. When the number of error bits is greater than a threshold value of correctable error bits, the ECC component 138 may not correct the error bits, and instead may output an error correction fail signal.

The ECC component 138 may perform error correction through a coded modulation such as low density parity check (LDPC) code, Bose-Chaudhri-Hocquenghem (BCH) code, turbo code, Reed-Solomon (RS) code, convolution code, recursive systematic code (RSC), trellis-coded modulation (TCM) and block coded modulation (BCM). However, the ECC component 138 is not limited to any specific error correction technique or structure. As such, the ECC component 138 may include any and all circuits, modules, systems or devices for suitable error correction.

The PMU 140 may provide and manage power of the controller 130.

The memory I/F 142 may serve as a memory storage interface for interfacing the controller 130 and the memory device 150 such that the controller 130 controls the memory device 150 in response to a request from the host 102. When the memory device 150 is a flash memory or specifically a NAND flash memory, the memory I/F 142 may generate a control signal for the memory device 150 and process data to be provided to the memory device 150 under the control of the processor 134. The memory I/F 142 may work as an interface (e.g., a NAND flash interface) for processing a command and data between the controller 130 and the memory device 150. Specifically, the memory I/F 142 may support data transfer between the controller 130 and the memory device 150.

The memory 144 may serve as a working memory of the memory system 110 and the controller 130, and store data for driving the memory system 110 and the controller 130. The controller 130 may control the memory device 150 to perform read, write, program and erase operations in response to a request from the host 102. The controller 130 may provide data read from the memory device 150 to the host 102, may store data provided from the host 102 into the memory device 150. The memory 144 may store data for the controller 130 and the memory device 150 to perform these operations.

The memory 144 may be embodied by a volatile memory. For example, the memory 144 may be embodied by static random access memory (SRAM) or dynamic random access memory (DRAM). The memory 144 may be disposed within or externally to the controller 130. FIG. 1 exemplifies the memory 144 disposed within the controller 130. In another embodiment, the memory 144 may be embodied by an external volatile memory having a memory interface transferring data between the memory 144 and the controller 130.

The processor 134 may control the overall operations of the memory system 110. The processor 134 may drive firmware to control the overall operations of the memory system 110, The firmware may be referred to as flash translation layer (FTL). Also, the processor 134 may be realized as a microprocessor or a central processing unit (CPU).

For example, the controller 130 may perform an operation requested by the host 102 in the memory device 150 through the processor 134, which is realized as a microprocessor or a CPU. In other words, the controller 130 may perform a command operation corresponding to a command received from the host 102, or other source. The controller 130 may perform a foreground operation as the command operation corresponding to the command received from the host 102. For example, the controller 130 may perform a program operation corresponding to a write command, a read operation corresponding to a read command, an erase operation corresponding to an erase command, and a parameter set operation corresponding to a set parameter command or a set feature command.

Also, the controller 130 may perform a background operation onto the memory device 150 through the processor 134, which is realized as a microprocessor or a CPU. The background operation performed onto the memory device 150 may include an operation of copying and processing data stored in some memory blocks among the memory blocks 152 to 156 of the memory device 150 into other memory blocks, e.g., a garbage collection (GC) operation, an operation of swapping data between select memory blocks of the memory blocks 152 to 156, e.g., a wear-leveling (WL) operation, an operation of storing the map data stored in the controller 130 in the memory blocks 152 to 156, e.g., a map flush operation, or an operation of managing bad blocks of the memory device 150, e.g., a bad block management operation of detecting and processing bad blocks among the memory blocks 152 to 156.

A memory device of the memory system in accordance with an embodiment of the present invention is described in detail with reference to FIGS. 2 to 4.

Figure 2:
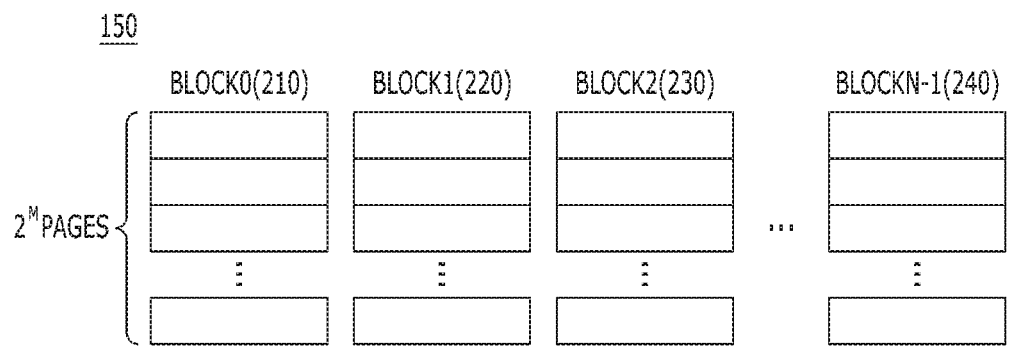
FIG. 2 is a schematic diagram illustrating an exemplary configuration of a memory device employed in the memory system of FIG. 1.

FIG. 2 is a schematic diagram illustrating a memory device, e.g., the memory device 150 of FIG. 1, in accordance with an embodiment of the present invention. FIG. 3 is a circuit diagram illustrating an exemplary configuration of a memory cell array of a memory block in the memory device 150. FIG. 4 is a schematic diagram illustrating an exemplary three-dimensional (3D) structure of the memory device 150.

Referring to FIG. 2, the memory device 150 may include a plurality of memory blocks BLOCK0 to BLOCKN-1, e.g., BLOCK0 (210), BLOCK1 (220), BLOCK2 (230), and to BLOCKN-1 (240). Each of the memory blocks 210, 220, 230 and 240 may include a plurality of pages, for example $2^M$ pages, the number of which may vary according to circuit design. For example, in some applications, each of the memory blocks may include M pages. Each of the pages may include a plurality of memory cells that are coupled to a plurality of word lines WL.

Also, the memory device 150 may include a plurality of memory blocks, which may include a single level cell (SLC) memory block having SLCs each storing 1-bit data and/or a multi-level cell (MLC) memory block having MLCs each storing two or more bit data. In accordance with an embodiment of the present invention, the memory device 150 is described as a non-volatile memory, such as a flash memory, e.g., a NAND flash memory. However, the memory device 150 may be realized as any of a phase change random access memory (PCRAM), a resistive random access memory (RRAM or ReRAM), a ferroelectric random access memory (FRAM), a spin transfer torque magnetic random access memory (STT-RAM or STT-MRAM).

The memory blocks 210, 220, 230 and 240 may store the data transferred from the host 102 through a program operation, and transfer data stored therein to the host 102 through a read operation.

Figure 3:
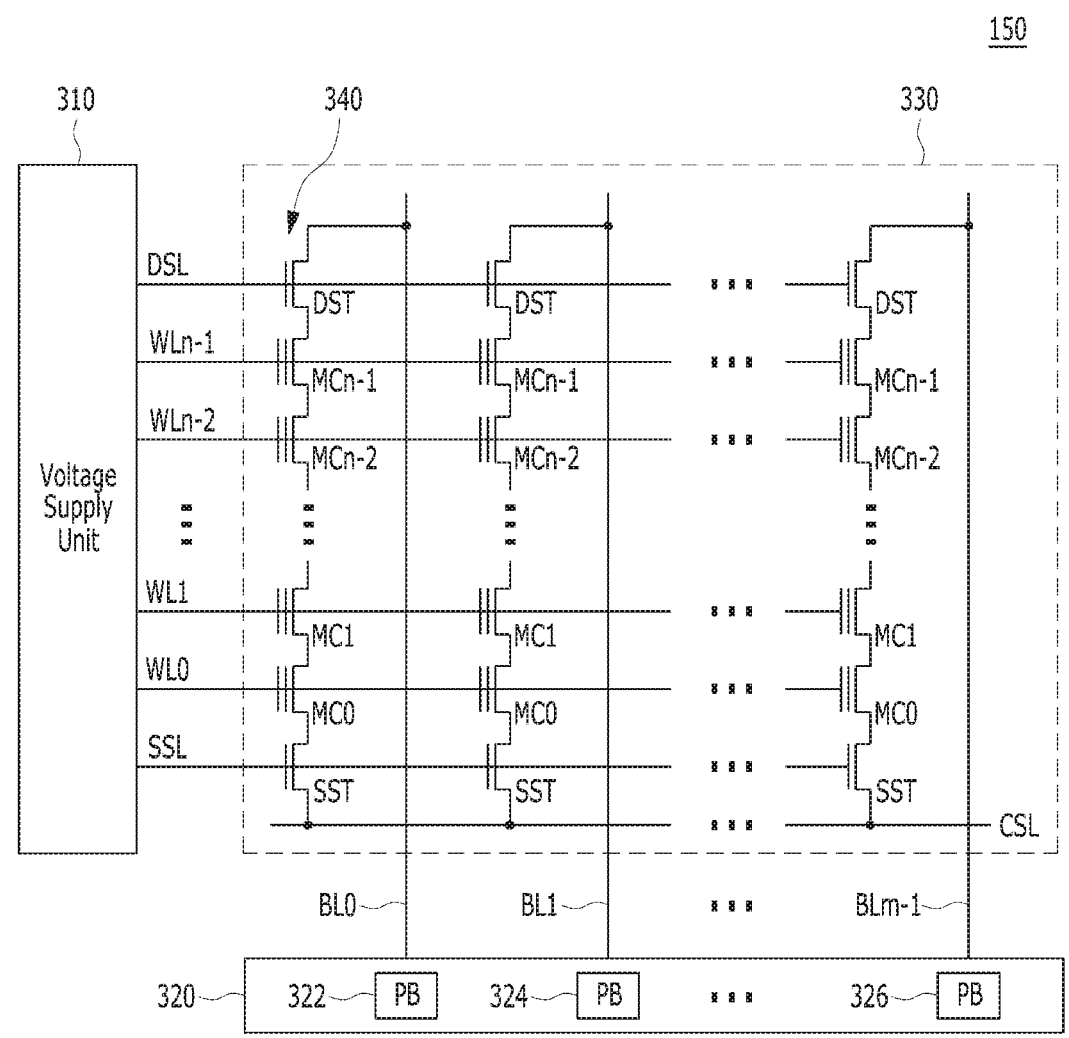
FIG. 3 is a circuit diagram illustrating an exemplary configuration of a memory cell array of a memory block in the memory device shown in FIG. 1.
Figure 4:
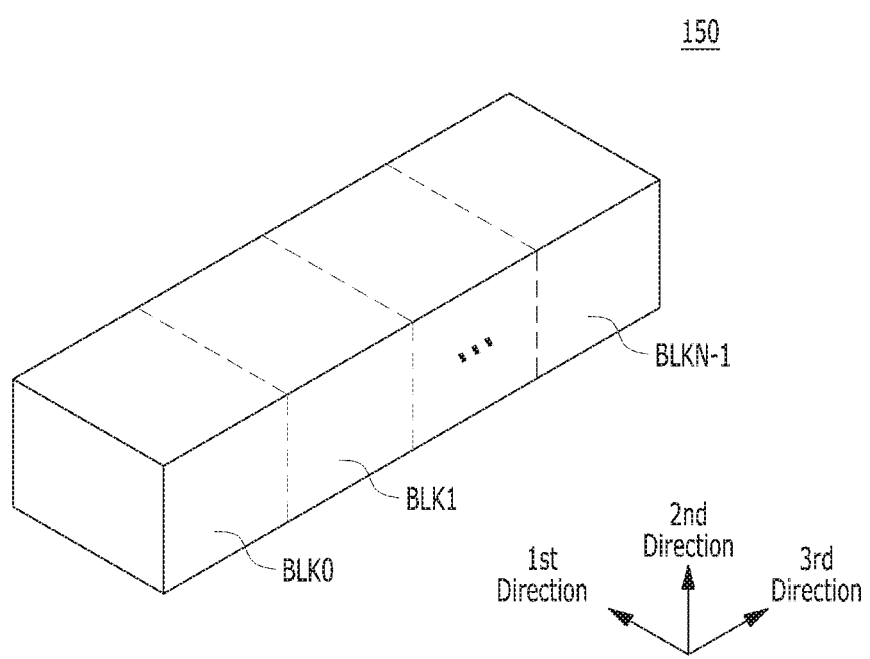
FIG. 4 is a block diagram illustrating an exemplary three-dimensional structure of the memory device shown in FIG. 2.

Referring to FIG. 3, a memory block 330 may correspond to any of the plurality of memory blocks 152 to 156 included in the memory device 150 of the memory system 110. The memory block 330 may include a plurality of cell strings 340 coupled to a plurality of corresponding bit lines BL0 to BLm-1. The cell string 340 of each column may include one or more drain select transistors DST and one or more source select transistors SST. Between the drain and source select transistors DST and SST, a plurality of memory cells MC0 to MCn-1 may be coupled in series. In an embodiment, each of the memory cell transistors MC0 to MCn-1 may be embodied by an MLC capable of storing data information of a plurality of bits. Each of the cell strings 340 may be electrically coupled to a corresponding bit line among the plurality of bit lines BL0 to BLm-1. For example, as illustrated in FIG. 3, the first cell string is coupled to the first bit line BL0, and the last cell string is coupled to the last bit line BLm-1. For reference, in FIG. 3, 'DSL' denotes a drain select line, 'SSL' denotes a source select line, and 'CSL' denotes a common source line.

Although FIG. 3 illustrates NAND flash memory cells, the invention is not limited in this way. It is noted that the memory cells may be NOR flash memory cells, or hybrid flash memory cells including two or more types of memory cells combined therein. Also, it is noted that the memory device 150 may be a flash memory device including a conductive floating gate as a charge storage layer or a charge trap flash (CTF) memory device including an insulation layer as a charge storage layer.

The memory device 150 may further include a voltage supply 310. The voltage supply 310 may provide word line voltages including a program voltage, a read voltage and a pass voltage to supply to the word lines according to an operation mode. The voltage generation operation of the voltage supply 310 may be controlled by a control circuit (not illustrated). Under the control of the control circuit, the voltage supply 310 may select one of the memory blocks (or sectors) of the memory cell array, select one of the word lines of the selected memory block, and provide the word line voltages to the selected word line and the unselected word lines as may be needed.

The memory device 150 may include a read and write (read/write) circuit 320 which is controlled by the control circuit. During a verification/normal read operation, the read/write circuit 320 may operate as a sense amplifier for reading data from the memory cell array. During a program operation, the read/write circuit 320 may operate as a write driver for driving bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers (PBs) 322 to 326 respectively corresponding to columns (or bit lines) or column pairs (or bit line pairs), and each of the page buffers 322 to 326 may include a plurality of latches (not illustrated).

The memory device 150 may be embodied by a two-dimensional (2D) or three-dimensional (3D) memory device. Particularly, as illustrated in FIG. 4, the memory device 150 may be embodied by a nonvolatile memory device having a 3D stack structure. When the memory device 150 has a 3D structure, the memory device 150 may include a plurality of memory blocks BLOCK0 to BLOCKN-1. FIG. 4 is a block diagram illustrating the memory blocks 152 to 156 of the memory device 150 shown in FIG. 1. Each of the memory blocks 152 to 156 may be realized in a 3D structure (or vertical structure). For example, the memory blocks 152 to 156 may be a three-dimensional structure with dimensions extending in first to third directions, e.g., an x-axis direction, a y-axis direction, and a z-axis direction.

Each memory block 330 in the memory device 150 may include a plurality of NAND strings NS that are extended in the second direction, and a plurality of NAND strings NS (not shown) that are extended in the first direction and the third direction. Each of the NAND strings NS may be coupled to a bit line BL, at least one string selection line SSL, at least one ground selection line GSL, a plurality of word lines WL, at least one dummy word line DWL (not shown), and a common source line CSL, and each of the NAND strings NS may include a plurality of transistor structures TS (not shown).

In short, each memory block 330 may be coupled to a plurality of bit lines BL, a plurality of string selection lines SSL, a plurality of ground selection lines GSL, a plurality of word lines WL, a plurality of dummy word lines DWL, and a plurality of common source lines CSL, and each memory block 330 may include a plurality of NAND strings NS. Also, in each memory block 330, one bit line BL may be coupled to a plurality of NAND strings NS to realize a plurality of transistors in one NAND string NS. Also, a string selection transistor SST of each NAND string NS may be coupled to a corresponding bit line BL, and a ground selection transistor GST of each NAND string NS may be coupled to a common source line CSL. Memory cells MC may be provided between the string selection transistor SST and the ground selection transistor GST of each NAND string NS. In other words, a plurality of memory cells may be realized in each memory block 330 of the memory blocks 152 to 156 of the memory device 150.

Figure 5:
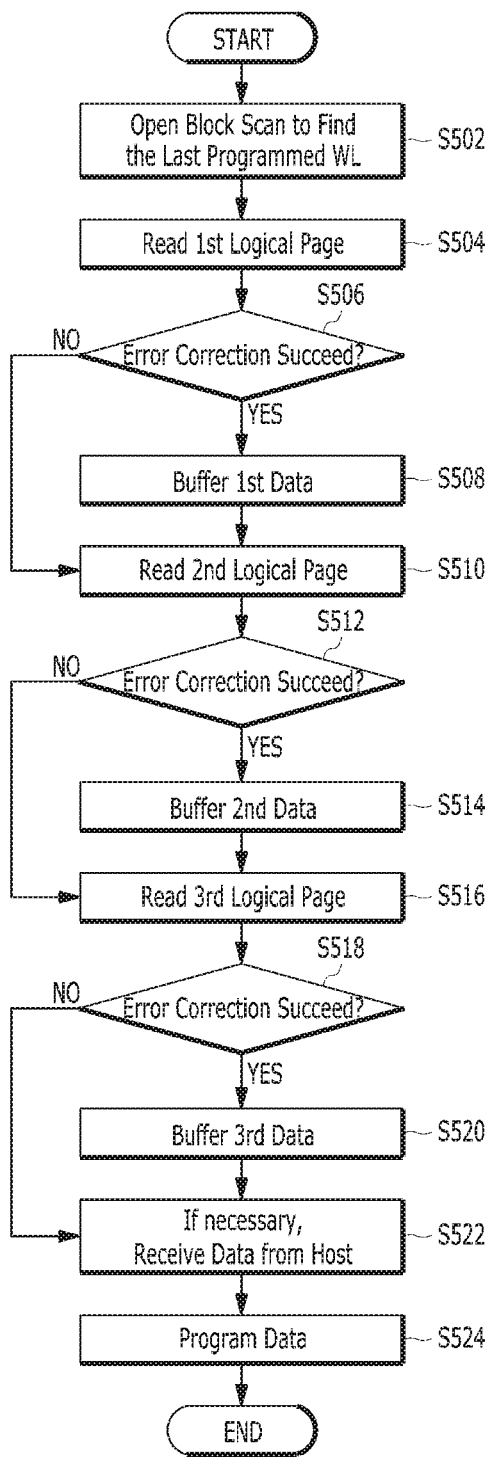
FIG. 5 is a flowchart illustrating a conventional sudden power-off recovery operation of a triple level cell (TLC) memory device.

FIG. 5 is a flowchart illustrating a conventional sudden power-off recovery operation of a triple level cell (TLC) memory device.

A memory system including a nonvolatile memory device may perform a sudden power-off (SPO) recovery operation when the memory system is powered on after a sudden power-off.

While a program operation is performed on an open memory block, a sudden power-off may occur in the memory system. Thus, when a sudden power-off occurs in the memory system, the last programmed word line in the open memory block at the time of the sudden power-off may store unstable data.

Therefore, when the memory system is powered on, the memory system may find the last programmed word line in the open memory block, read data stored in a memory region corresponding to the last programmed word line, and program the read data to another region, thereby stably storing the data. When failing in error correction on the read data, the memory system may provide a request to a host, and receive data corresponding to the read data.

When powered on after the sudden power-off, a series of processes collectively referred to as a sudden power-off recovery operation may be performed. In the sudden power-off recovery operation, the memory system finds the last programmed word line in the open memory block when powered on after the sudden power-off, and stores data corresponding to the word line in another region of the memory device.

As described with reference to FIG. 2, a nonvolatile memory device may include a multi-level cell (MLC) memory device capable of storing a plurality of data in one memory cell. That is, the memory system may store data corresponding to a plurality of logical pages by programming one word line. The memory system including the multi-level cell memory device may read data corresponding to the respective logical pages that correspond to the last programmed word line, and perform error detection and correction on the read data, in order to perform the sudden power-off recovery operation. The Is memory system may provide a request to the host, and receive data corresponding to data on which error correction failed (error correction-failed data). The memory system may store the corrected data and the data received from the host in another region of the memory device.

FIG. 5 illustrates a sudden power-off recovery operation of a memory system including a triple-level cell (TLC) memory device and a controller.

Referring to FIG. 5, at step S502, the controller performs an open memory block scan operation of scanning an open memory block of the memory device in order to find the last programmed word line (WL).

At step S504, the controller controls the memory device to read 1st data corresponding to a 1st logical page among logical pages, corresponding to the last programmed word line.

At step S506, the controller performs error detection and correction on the 1st data read from the memory device. Further, the controller determines whether error correction on the 1st data succeeded or failed.

When the error correction succeeded ("YES" at step S506), at step S508, the controller buffers the corrected 1st data in a buffer thereof.

When the error correction failed ("NO" at step S506), the controller performs step S510.

At step S510, the controller controls the memory device to read 2nd data corresponding to a 2nd logical page among the logical pages corresponding to the last programmed word line.

At step S512, the controller performs error detection and correction on the 2nd data read from the memory device. Further, the controller determines whether error correction on the 2nd data succeeded or failed.

When the error correction succeeded ("YES" at step S512), the controller buffers the corrected 2nd data in the buffer at step S514.

When the error correction failed ("NO" at step S512), the controller performs step S516.

At step S516, the controller controls the memory device to read 3rd data corresponding to a 3rd logical page among the logical pages corresponding to the last programmed word line.

At step S518, the controller performs error detection and correction on the 3rd data read from the memory device.

When the error correction succeeded ("YES" at step S518), the controller buffers the corrected 3rd data in the buffer at step S520.

When the error correction failed ("NO" at step S518), the controller performs step S522.

When there are data which are not buffered due to failure in error correction at one or more steps of steps S506, S512 and S518, the controller provides a request to the host and receive the non-buffered data from the host at step S522.

At step S524, the controller controls the memory device to program the buffered data and the data received from the host to another memory region.

As described above, the memory system including the multi-level cell memory device needs to perform the read and error correction operation on all of the logical pages corresponding to the last programmed word line in order to recover a sudden power-off of the memory system.

Figure 6:
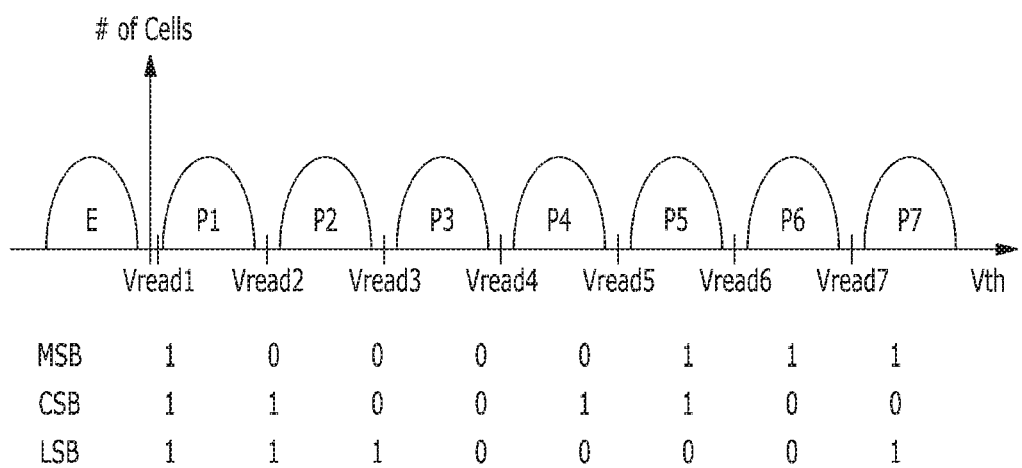
FIG. 6 a diagram illustrating threshold voltage distributions of a memory device.

FIG. 6 illustrates threshold voltage distributions of the memory device 150 of FIGS. 1 to 4.

When the memory device 150 is a triple-level cell (TLC) memory device, each of a plurality of memory cells coupled to a word line may store three bits of data. FIG. 6 illustrates voltage distributions which a TLC can have. When a TLC is programmed, the TLC may have any one threshold voltage state among seven program states P1 to P7 and one erase state E. For example, each of the eight states may be mapped to a gray code, and thus represent three bits of data. During a read operation, the eight states may be distinguished through seven read voltages Vread1 to Vread7. FIG. 6 exemplifies data which the respective threshold voltage states can represent. For example, in FIG. 6, a memory cell in the erase state E may have a logical value of '111', and a memory cell in the 5th program state P5 may have a logical value of '110'.

The multi-level cell memory device 150 may perform a program operation on a plurality of logical pages by applying a program voltage to one word line. The memory device 150 may perform a series of processes as a one-shot program operation. In a one-shot program operation, the memory device 150 buffers all of data corresponding to a plurality of logical pages in a page buffer PB and then performs program operations on all of the logical pages.

When a program operation is performed on a word line included in the multi-level cell memory device 150, each of memory cells coupled to the word line may be programmed to target any one of the threshold voltage states which the multi-level cell can have, according to a bit value that is intended to be stored in the memory cell. When the memory device 150 performs the one-shot program operation, threshold voltage distributions of the memory cells may be sequentially formed from memory cells having a low target threshold voltage state to memory cells having a high target threshold voltage state.

Figure 7A:
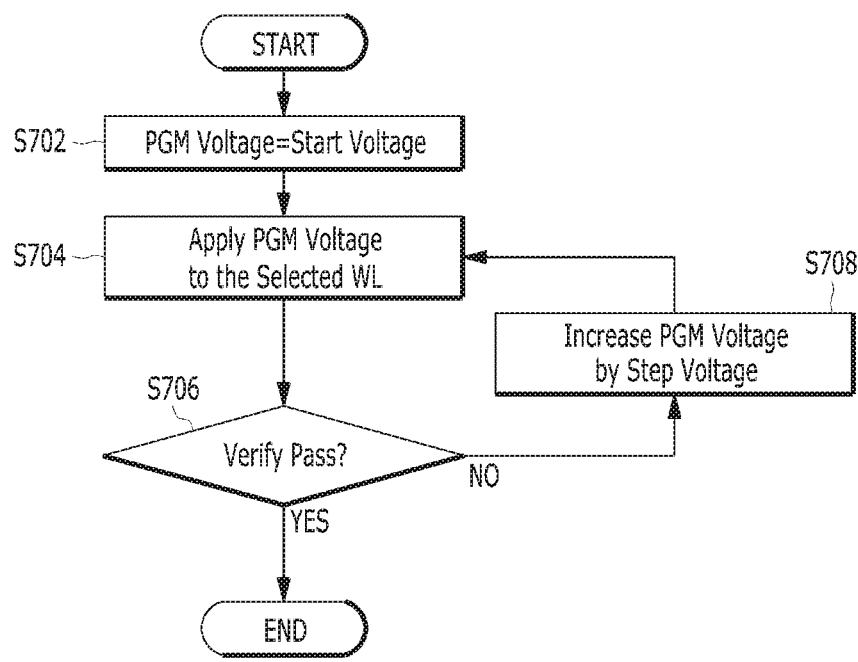
FIGS. 7A and 7B are a flowchart and diagram illustrating threshold voltage distributions of memory cells, which are formed through a one-shot program operation of a memory device.
Figure 7B:
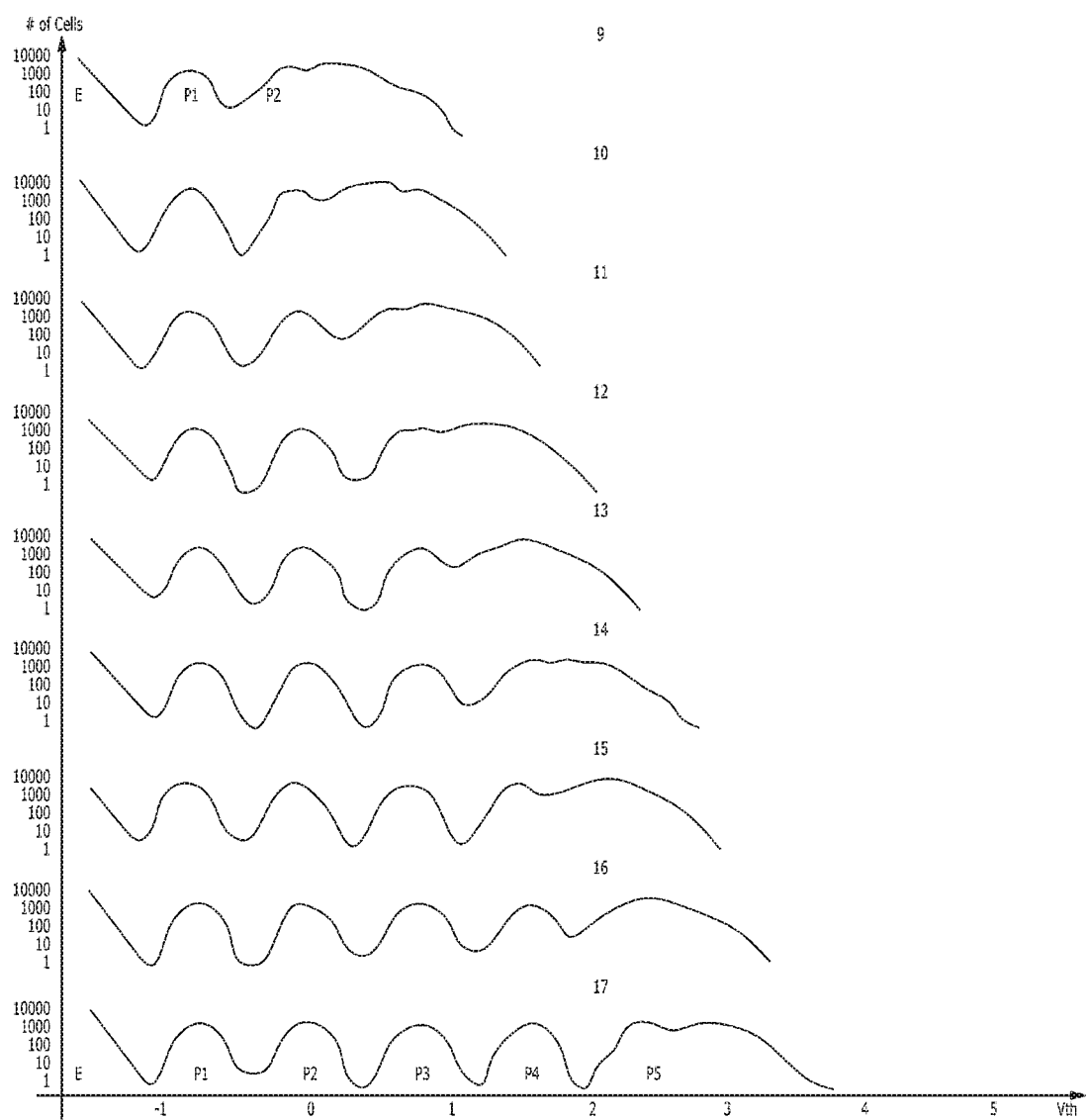

FIGS. 7A and 7B are a flowchart and diagram illustrating the threshold voltage distributions of the memory cells, which are formed through a one-shot program operation of the memory device 150.

As one of the one-shot program methods of the memory device 150, an incremental step pulse program (ISPP) method is known.

FIG. 7A is a flowchart illustrating a one-shot program operation based on the ISPP method.

Referring to FIG. 7A, at step S702, the memory device 150 sets a start voltage to a program (PGM) voltage. At step S704, the memory device 150 applies the program voltage to a word line to be programmed.

At step S706, the memory device 150 applies a verify voltage to the word line in order to verify whether each of the memory cells has reached its target threshold voltage.

When the number of memory cells having passed the verification is greater than or equal to a set value, which may be predetermined ("YES" at step S706), the program operation ends.

On the other hand, when the number of memory cells having passed the verification is less than the set value ("NO" at step S706), at step S708, the memory device 150 increases the program voltage by a step voltage. Then, the memory device 150 performs the operation of step S704 on memory cells which have not yet passed the verification. The memory device 150 repeats the process until the number of memory cells passing the verification is greater than or equal to the set value.

FIG. 7B illustrates threshold voltage distributions of memory cells through the one-shot program operation based on the ISPP method.

With reference to FIG. 7B, when the memory device 150 performs a program operation based on the ISPP method, the threshold voltage distributions of the memory cells from memory cells Is having a low threshold voltage state to memory cells having a high threshold voltage state may be sequentially completed to form the distributions as illustrated in FIG. 6.

FIG. 7B illustrates nine threshold voltage distribution graphs. In each of the graphs, the horizontal axis indicates the threshold voltages (i.e., Vth) of memory cells, and the vertical axis indicates the numbers of memory cells (i.e., # of cells) having the corresponding threshold voltages.

The 1st graph indicates threshold voltage distributions when applying a program voltage to a word line is repeated nine times while a program operation is performed through the ISPP method. The 1st graph shows that, when the program voltage is applied nine times to the word line, the threshold voltage distributions of the memory cells may be formed as an erase state E and 1st and 2nd program states P1 and P2.

The 2nd graph indicates threshold voltage distributions when applying the program voltage to the word line is repeated 10 times. The 3rd graph indicates threshold voltage distributions when applying the program voltage to the word line is repeated 11 times. The 9th graph indicates threshold voltage distributions when applying the program voltage to the word line is repeated 17 times.

The 9th graph shows that, when the program voltage is applied 17 times to the word line, the threshold voltage distributions of the memory cells may be formed as the erase state E and the 1st to 5th program states P1 to P5.

If a program voltage is additionally applied, all of the voltage distributions corresponding to the erase state E and the 1st to 7th program states P1 to P7 may be formed.

Figure 8:
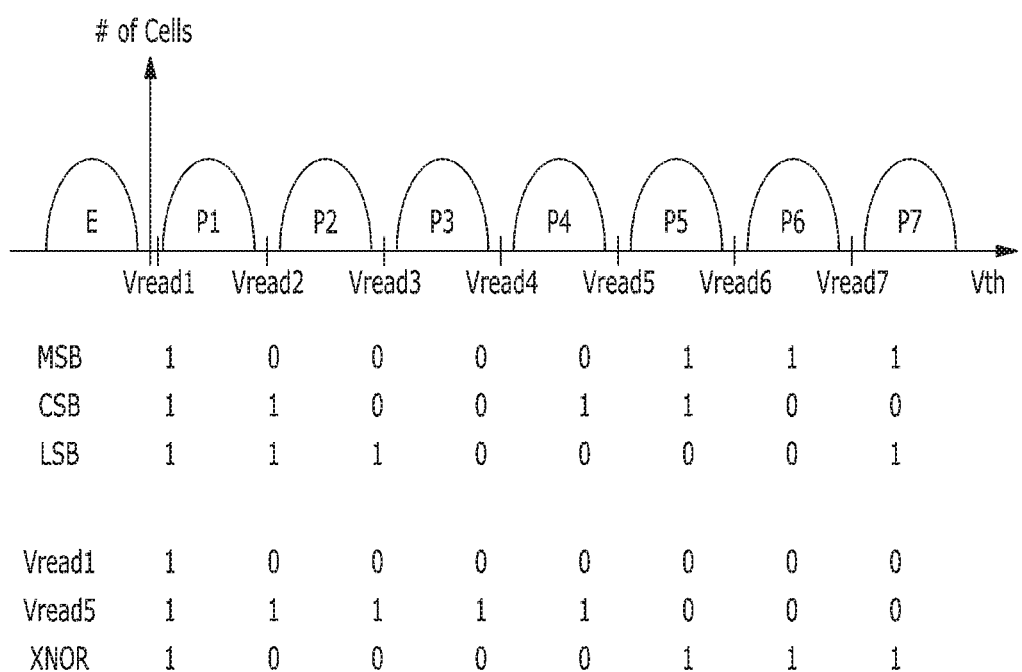
FIG. 8 is a diagram illustrating the order in which a plurality of logical pages are completely programmed.

FIG. 8 is a diagram illustrating the order in which a plurality of logical pages are completely programmed.

In FIG. 8, the threshold voltage distributions and gray codes mapped to the respective threshold voltage states may be the same as described with reference to FIG. 6.

In the example of FIG. 8, the memory device 150 may read data stored in a most significant bit (MSB) page by applying the 1st and 5th read voltages Vread1 and Vread5 to the word line.

Specifically, when the memory device 150 applies the 1st read voltage Vread1 to the word line, a current may flow through a bit line corresponding to a memory cell in the erase state E because the threshold voltage of the memory cell is less than the 1st read voltage Vread1, and no current may flow through bit lines corresponding to memory cells in the program states P1 to P7 because the threshold voltages of the memory cells are greater than the 1st read voltage Vread1. Therefore, the erase state E may be distinguished from the program states P1 to P7.

Similarly, when the memory device 150 applies the 5th read voltage Vread5 to the word line, the threshold voltage states from the erase state E to the 4th program state P4 may be distinguished from the threshold voltage states from the 5th program state P5 to the 7th program state P7.

Therefore, the memory device 150 may read data stored in the MSB page by performing a logical operation (e.g., XNOR) on read results after applying the 1st and 5th read voltages Vread1 and Vread5.

Similarly, the memory device 150 may read data stored in a center significant bit (CSB) page by applying the 2nd, 4th and 6th read voltages Vread1, Vread4 and Vread6 to the word line, and read data stored in a least significant bit (LSB) page by applying the 3rd and 7th read voltages Vread3 and Vread7.

Referring back to FIG. 7B, when the memory device 150 completes the program operations for six threshold voltage states including the states E to P5 by repeatedly applying the program voltage to the word line, a read operation may be successfully performed on the MSB page corresponding to the word line in the examples of FIGS. 6 and 8, even though the entire program operations have not been completed.

Similarly, when the memory device 150 completes the program operations for seven threshold voltage states including the states E to P6 by repeatedly applying the program voltage to the word line, a read operation may be successfully performed on the MSB page and the CSB page corresponding to the word line.

That is, when the memory device 150 having the threshold Is voltage distributions and the gray code mapping of FIGS. 6 and 8 performs the one-shot program operation, the program operation for the MSB page among the plurality of logical pages corresponding to the word line to be programmed may be first completed, and the program operations for the CSB page and the LSB page may be sequentially completed.

According to the sudden power-off recovery operation described with reference to FIG. 5, the memory system including the multi-level cell memory device needs to perform the read and error correction operations on all of the logical pages corresponding to the last programmed word line in order to recover a sudden power-off of the memory system. The ECC component 138 of FIG. 1 may perform the error correction using an algorithm such as hard decision, soft decision or chipkill, and one or more algorithms may be applied to perform one error correction operation on each of the logical pages. When the ECC component 138 performs one or more error correction operations on each of the logical pages, the sudden power-off recovery time may be increased.

In accordance with an embodiment, when the sudden power-off recovery operation of the memory system 110 including the multi-level cell memory device 150 is performed, the memory system 110 may perform a read operation on the logical pages corresponding to the last programmed word line in the order that the logical pages are completely programmed. When the memory system 110 fails in error correction on the first programmed logical page, it is difficult to expect that error correction on the next programmed logical page will be successfully performed.

Therefore, when error correction on the first programmed logical page fails, the memory system 110 may not perform a read operation on the next logical page. In accordance with an embodiment, the memory system 110 may not perform useless error correction during a sudden power-off recovery operation, thereby reducing the entire sudden power-off time.

Figure 9:
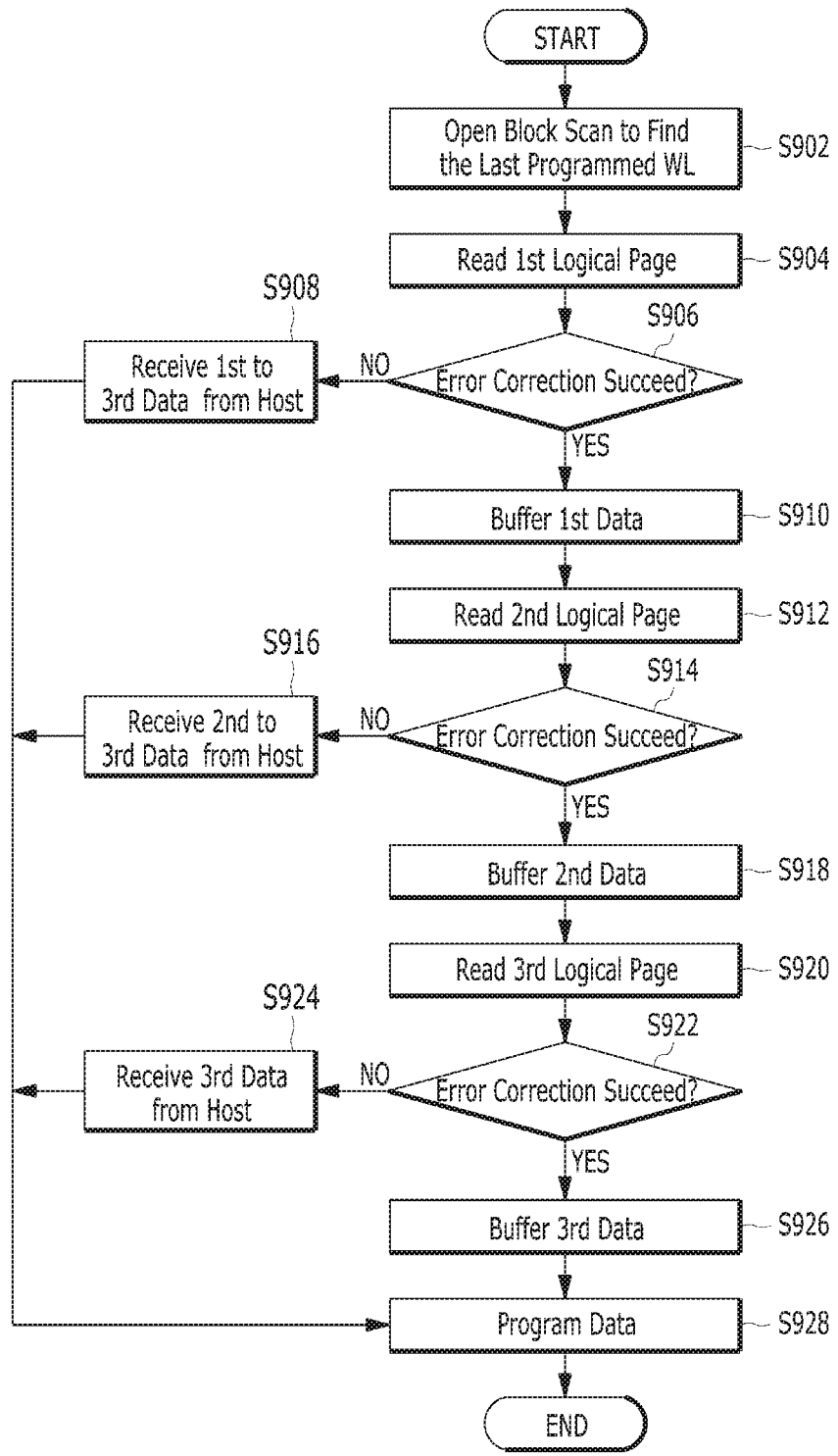
FIG. 9 is a flowchart illustrating a sudden power-off recovery operation of a memory system in accordance with an embodiment.

FIG. 9 illustrates a sudden power-off recovery operation of a memory system, e.g., the memory system 110 of FIG. 1, in accordance with the present embodiment.

Referring to FIG. 9, at step S902, the processor 134 of FIG. 1 may perform an open memory block scan operation to search for and find the last programmed word line (WL).

At step S904, the processor 134 may control the memory device 150 to perform a read operation on a 1st logical page among a plurality of logical pages corresponding to the last programmed word line. The 1st logical page may indicate a logical page which is completely programmed for the first time by a one-shot program operation, among the logical pages corresponding to the last programmed word line. In the example of FIGS. 6 and 8, the 1st logical page may correspond to the MSB page.

At step S906, the ECC component 138 may perform error detection and correction on 1st data read from the 1st logical page of the memory device 150. Further, the ECC component 138 may determine whether error correction on the 1st data succeeded or failed.

When the ECC component 138 succeeded in the error correction ("YES" at step S906), the processor 134 may buffer the corrected 1st data in the memory 144 at step S910.

When the ECC component 138 failed in the error correction ("NO" at step S906), the processor 134 may perform an operation of step S908, not perform operations of steps S910 to S926. At step S908, the processor 134 may request the host 102 of data which are to be programmed to a memory region corresponding to the last programmed word line. The processor 134 may receive the requested data (e.g., 1st to 3rd data) from the host 102 through the host interface 132, and buffer the received data in the memory 144.

After the buffering operation of step S910, the processor 134 may control the memory device 150 to perform a read operation on a 2nd logical page among the plurality of logical pages corresponding to the last programmed word line at step S912. The 2nd logical page may indicate a logical page which is completely programmed for the second time by the one-shot program operation, among the logical pages corresponding to the last programmed word line. In the example of FIGS. 6 and 8, the 2nd logical page may correspond to the CSB page.

At step S914, the ECC component 138 may perform error detection and correction on 2nd data read from the 2nd logical page of the memory device 150. Further, the ECC component 138 may determine whether error correction on the 2nd data succeeded or failed.

When the ECC component 138 succeeded in the error correction ("YES" at step S914), the processor 134 may buffer the corrected 2nd data in the memory 144 at step S918. As the result of step S918, the 1st and 2nd data may be buffered in the memory 144.

When the ECC component 138 failed in the error correction ("NO" at step S914), the processor 134 may perform an operation of step S916, not perform operations of steps S918 to S926. At step S916, the processor 134 may request the host 102 of data excluding the 1st data on which the error correction succeeded at step S906, among the data to be programmed to the memory region corresponding to the last programmed word line. The processor 134 may receive the requested data (e.g., 2nd and 3rd data) from the host 102 through the host interface 132, and buffer the received data in the memory 144 with the 1st data.

After the buffering operation of step S918, the processor 134 may control the memory device 150 to perform a read operation on a 3rd logical page among the plurality of logical pages corresponding to the last programmed word line at step S920. The 3rd logical page may indicate a logical page which is completely programmed for the third time by the one-shot program operation, among the logical pages corresponding to the last programmed word line. In the case of a TLC memory device, the 3rd logical page may indicate a logical page which is completely programmed for the last time. in the example of FIGS. 6 and 8, the 3rd logical page may correspond to the LSB page.

At step S922, the ECC component 138 may perform error detection and correction on 3rd data read from the 3rd logical page of the memory device 150. Further, the ECC component 138 may determine whether error correction on the 3rd data succeeded or failed.

When the ECC component 138 succeeded in the error correction ("YES" at step S922), the processor 134 may buffer the corrected 3rd data in the memory 144 at step S926. The 1st to 3rd data may be currently buffered in the memory 144.

When the ECC component 138 failed in the error correction ("NO" at step S922), the processor 134 may request the host 102 of data excluding the 1st and 2nd data on which the error correction succeeded, among the data to be programmed to the memory region corresponding to the last programmed word line, at step S924. The processor 134 may receive the data (e.g., 3rd data) from the host 102 through the host interface 132, and buffer the received data in the memory 144 with the 1st and 2nd data.

At step S928, the processor 134 may program the buffered data to another region of the memory device 150.

As described above, when the error correction on the first programmed logical page failed, the memory system 110 may not perform a read operation on the other logical pages where likelihood of successful error correction is low, that is, success is difficult to expect, thereby reducing the time required for the error correction operation. Thus, the entire sudden power-off time of the memory system 110 may be reduced to thereby improve the performance.

As described with reference to FIG. 9, the 1st to 3rd logical pages among the plurality of logical pages may be determined according to the order that the logical pages are completely programmed. In other words, each of the 1st to 3rd logical pages may be determined according to the highest read voltage among the read voltages for reading the corresponding logical page. The 1st to 3rd logical pages may be determined in ascending order of the highest read voltages. In the example of FIG. 8, the highest read voltage of the MSB page is the 5th read voltage Vread5, the highest read voltage of the CSB page is the 6th read voltage Vread6, and the highest read voltage of the LSB page is the 7th read voltage Vread7. Therefore, the 1st logical page is the MSB page, the 2nd logical page is the CSB page, and the 3rd logical page is the LSB page.

In the present embodiment, the case in which the TLC memory device is programmed by the one-shot program operation through the ISPP method has been described with reference to FIGS. 6 to 9. However, the present embodiment is not limited thereto.

For example, the present embodiment may also be applied to a memory system 110 which programs a memory cell through a foggy-fine method.

Figure 10:
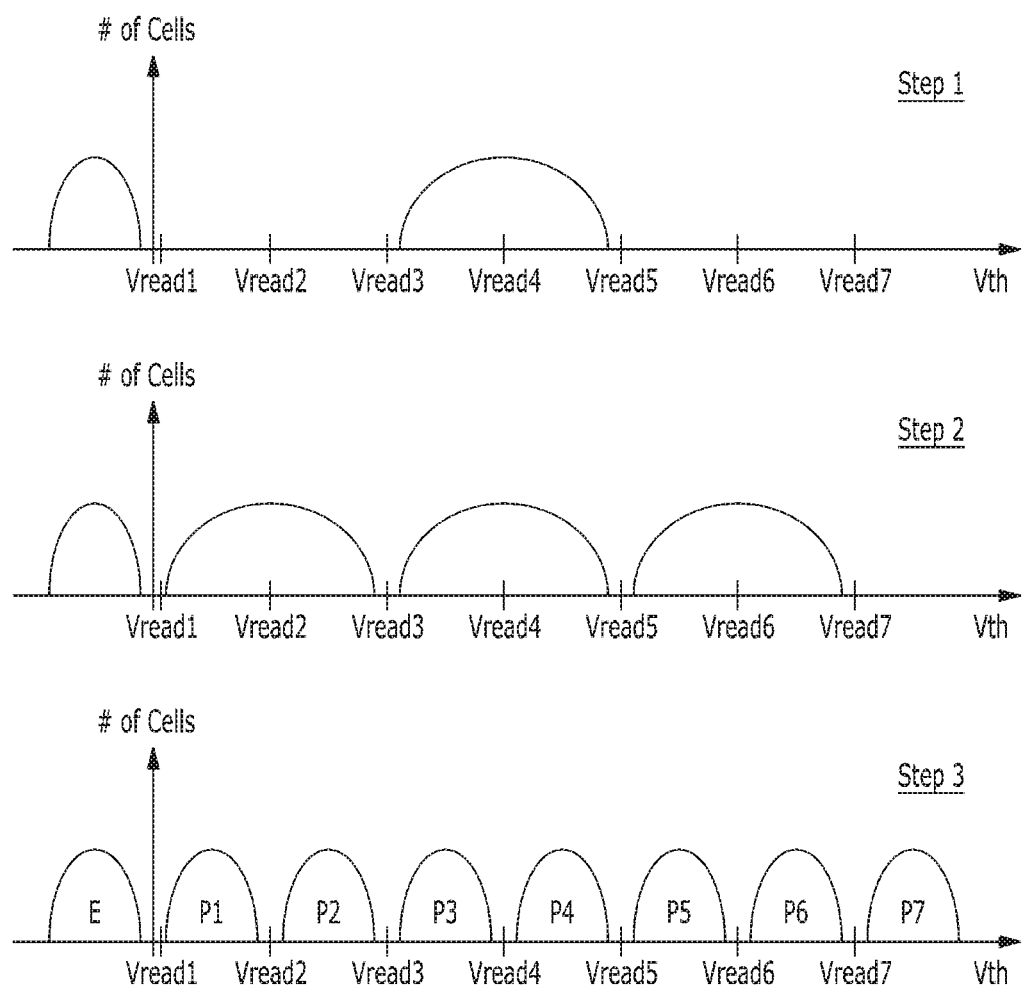
FIG. 10 a diagram illustrating threshold voltage distributions of memory cells, which are formed through a one-shot program operation based on a foggy-fine method.

FIG. 10 illustrates threshold voltage distributions of memory cells, which are formed through a one-shot program operation based on the foggy-fine method. The one-shot program operation based on the foggy-fine method may be performed by the memory system 110 including the memory device 150 of FIG. 1.

Referring to FIG. 10, the memory device 150 may perform a 1st program step Step1 of increasing the threshold voltages of memory cells having a high target threshold voltage by applying a voltage to a word line to be programmed.

The memory device 150 may perform a 2nd program step Step2 of increasing the threshold voltages of the respective memory cells to values close to the target threshold voltages of the respective memory cells by applying a voltage to the word line.

The memory device 150 may perform a 3rd program step Step3 of finely adjusting the threshold voltages of the respective memory cells such that the respective memory cells have the target threshold voltages. The memory system 110 may sequentially perform the 1st to 3rd steps, thereby completing the one-shot program operation through the foggy-fine method.

The 3rd program step may be sequentially performed on the memory cells from memory cells having a low target voltage to memory cells having a high target voltage. That is, when the memory device 150 having the gray code mapping of FIG. 10 performs the one-shot program operation, the program operation for the MSB page among the plurality of logical pages corresponding to the word line to be programmed may be first completed, and the program operations for the CSB page and the LSF page may be sequentially completed.

Therefore, the memory system 110 in accordance with the present embodiment may perform the operation described with reference to FIG. 9 regardless of the one-shot program method, thereby reducing the time required for the sudden power-off recovery operation. The present embodiment may also be applied to a memory system 110 which uses another gray code mapping method.

Figure 11:
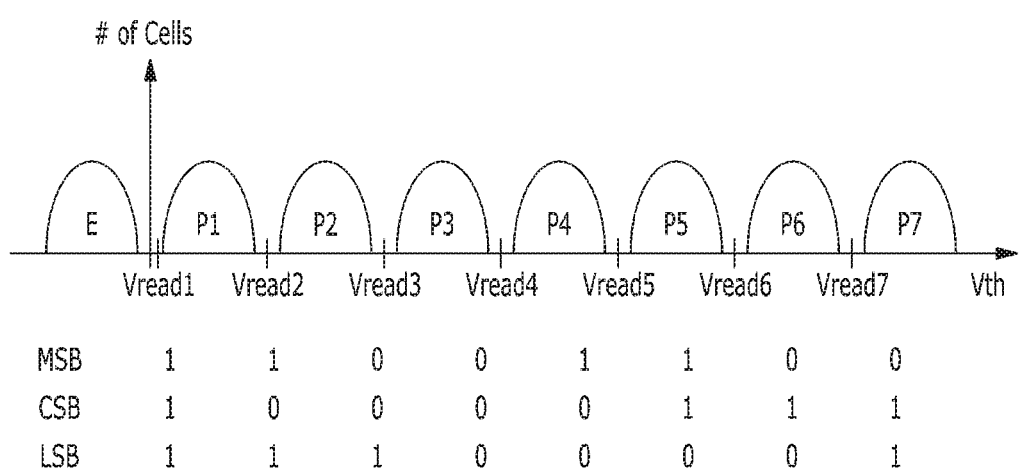
FIG. 11 a diagram illustrating threshold voltage distributions of a memory device.

FIG. 11 illustrates threshold voltage distributions of the memory device 150 of FIG. 1.

FIG. 11 shows that each of the eight threshold voltage states which a triple level cell (TLC) can have may be mapped to a gray code in a different manner from the example of FIG. 6.

The memory device 150 may read data stored in the CSB page by applying the 1st and 5th read voltages Vread1 and Vread5 to the word line.

Similarly, the memory device 150 may read data stored in the MSB page by applying the 2nd, 4th and 6th read voltages Vread2, Vread4 and Vread6 to the word line, and read data stored in the LSB page by applying the 3rd and 7th read voltages Vread3 and Vread7 to the word line.

While the one-shot program operation of the memory device 150 is performed as described above, the threshold voltage distributions of the memory cells may be sequentially completed from the memory cells having the lowest threshold voltage to the memory cells having the highest threshold voltage. Thus, in the example of FIG. 11, the program operation for the CSB page among the plurality of logical pages corresponding to the word line to be programmed may be first completed, and the program operations for the MSB page and the LSB page may be sequentially completed.

Therefore, the memory system 110 in accordance with the present embodiment may perform the operation described with reference to FIG. 9 regardless of the gray code mapping method, thereby reducing the time required for the sudden power-off recovery operation. In the example of FIG. 11, the 1st logical page may correspond to the CSB page, the 2nd logical page may correspond to the MSB page, and the 3rd logical page may correspond to the LSB page.

Figure 12:
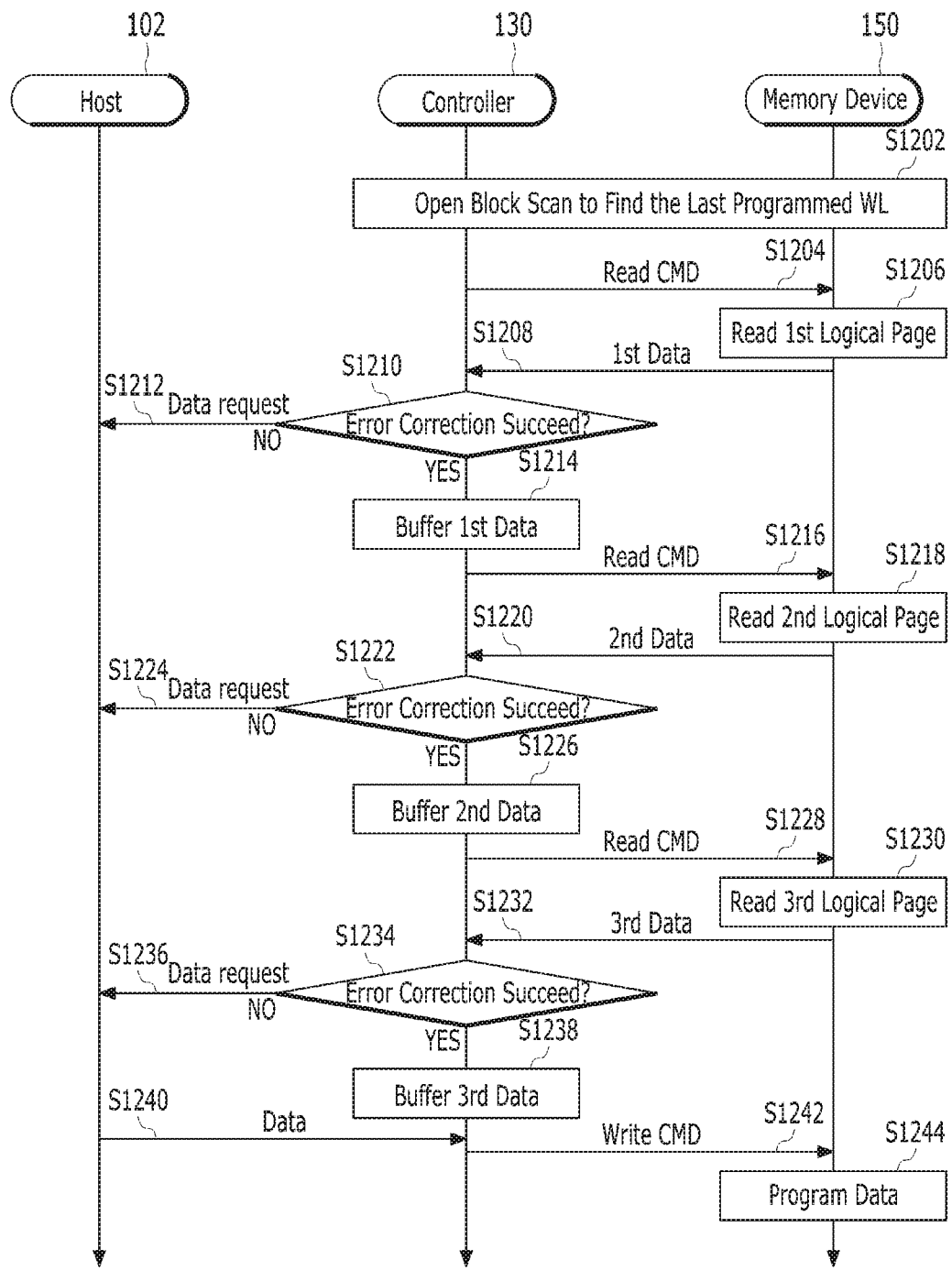
FIG. 12 is a flowchart illustrating a sudden power-off recovery operation of a memory system in accordance with an embodiment.

FIG. 12 is a flowchart illustrating a sudden power-off recovery operation of a memory system, e.g., the memory system 110 of FIG. 1, in accordance with an embodiment.

Referring to FIG. 12, at step S1202, the processor 134 may Is perform an open memory block scan operation to search for and find the last programmed word line (WL). The processor 134 may control the memory device 150 to perform the open memory block scan operation.

When step S1202 is completed, at step S1204, the processor 134 may provide a read command (CMD) to the memory device 150 to perform a read operation on a 1st logical page among a plurality of logical pages corresponding to the last programmed word line.

At step S1206, the memory device 150 may perform a read operation on the 1st logical page in response to the read command.

At step S1208, the memory device 150 may read and provide 1st data stored in the 1st logical page to the controller 130 through the memory interface 142.

At step S1210, the ECC component 138 may perform error detection and correction on the read 1st data. Further, the ECC component 138 may determine whether error correction on the 1st data succeeded or failed.

When the ECC component 138 succeeded in the error correction ("YES" at step S1210), the processor 134 may buffer the corrected 1st data in the memory 144 at step S1214.

When the ECC component 138 failed in the error correction ("NO" at step S1210), the processor 134 may perform step S1212, not perform steps S1214 to S1238. At step S1212, the processor 134 may request the host 102 of data to be programmed to a memory region corresponding to the last programmed word line.

At step S1240, the host 102 may provide the data to the processor 134 through the memory interface 142 in response to the request of step S1212. The processor 134 may buffer the provided data in the memory 144.

When the processor 134 completed the buffering of step S1214, the processor 134 may provide a read command to the memory device 150 to perform a read operation on the 2nd logical page among the plurality of logical pages at step S1216.

At step S1218, the memory device 150 may perform a read operation on the 2nd logical page in response to the read command.

At step S1220, the memory device 150 may read and provide 2nd data stored in the 2nd logical page to the controller 130 through the memory interface 142.

At step S1222, the ECC component 138 may perform error detection and correction on the read 2nd data. Further, the ECC component 138 may determine whether error correction on the 2nd data succeeded or failed.

When the ECC component 138 succeeded in the error correction ("YES" at step S1222), the processor 134 may buffer the corrected 2nd data in the memory 144 at step S1226.

When the ECC component 138 failed in the error correction ("NO" at step S1226), the processor 134 may perform a step S1224, not perform steps S1226 to 51238. At step S1224, the processor 134 may request the host 102 of data excluding the 1st data among the data to be programmed to the memory region corresponding to the last programmed word line.

At step S1240, the host 102 may provide the data to the processor 134 through the memory interface 142 in response to the request of step S1224. The processor 134 may buffer the data provided from the host in the memory 144 with the 1st data buffered at step S1214.

When the processor 134 completed the buffering of step S1226, the processor 134 may provide a read command to the memory device 150 to perform a read operation on the 3rd logical page among the plurality of logical pages at step S1228.

At step S1230, the memory device 150 may perform a read operation on the 3rd logical page in response to the read command.

At step S1232, the memory device 150 may read and provide 3rd data stored in the 3rd logical page to the controller 130 through the memory interface 142.

At step S1234, the ECC component 138 may perform error detection and correction on the read 3rd data. Further, the ECC component 138 may determine whether error correction on the 3rd data succeeded or failed.

When the ECC component 138 succeeded in the error correction ("YES" at step S1234), the processor 134 may buffer the corrected 3rd data in the memory 144 at step S1238.

When the ECC component 138 failed in the error correction ("NO" at step S1234), the processor 134 may request the host 102 of data excluding the 1st and 2nd data, among the data to be programmed to the memory region corresponding to the last programmed word line, at step S1236.

At step S1240, the host 102 may provide the data to the processor 134 through the memory interface 142 in response to the request of step S1236. The processor 134 may buffer the data provided from the host in the memory 144 with the 1st data buffered at step S1214 and the 2nd data buffered at step S1226.

At step S1242, the processor 134 may provide a write command to the memory device 150 to program the buffered data to another region.

At step S1244, the memory device 150 may program the buffered data in response to the write command.

The present embodiment can be applied to not only a TLC memory device, but also a multi-level cell memory device capable of storing plural-bit data in one memory cell.

Figure 13:
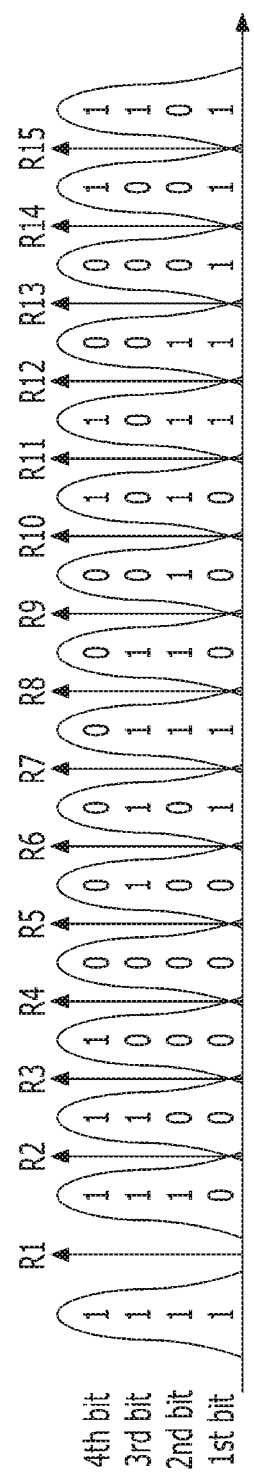
FIG. 13 a diagram illustrating threshold voltage distributions of a memory device.

FIG. 13 illustrates threshold voltage distributions of the memory device 150 of FIG. 1.

When the memory device 150 is a quadruple level cell (QLC) memory device, each of a plurality of memory cells coupled to a word line may store 4 bits of data. FIG. 13 illustrates voltage distributions which a QLC can have. The QLC may have any one threshold voltage state among 15 program states P1 to P15 and one erase state E. Each of the 16 states may be mapped to a gray code, for example, and thus represent 4 bits of data. During a read operation, the 16 states may be distinguished through 15 read voltages. FIG. 13 exemplifies data which the respective threshold voltage states can represent. FIG. 13 shows 1st bit, 2nd bit, 3rd bit and 4th bit according to the bit order. For example, the first bit may represent a most significant bit, and the fourth bit may represent a least significant bit.

In the example of FIG. 13, the memory device 150 may read data stored in the 4th bit page by applying 4th, 10th, 12th and 14th read voltages Vread4, Vread10, Vread12 and Vread14 (i.e., R4, R10, R12, R14) to the word line.

Similarly, the memory device 150 may read data stored in the 3rd bit page by applying 3rd, 5th, 9th and 15th read voltages Vread3, Vread5, Vread9 and Vread15 (i.e., R3, R5, R9, R15) to the word line. Further, the memory device 150 may read data stored in the 2nd bit page by applying 2nd, 7th and 13th read voltages Vread2, Vread7 and Vread13 (i.e., R2, R7, R13) to the word line. Furthermore, the memory device 150 may read data stored in the 1st bit page by applying 1st, 6th, 8th and 11th read voltages Vread1, Vread6, Vread8 and Vread11 (i.e., R1, R6, R8, R11) to the word line.

Even when the memory device 150 is a QLC memory device, the threshold voltage distributions of the memory cells may be sequentially completed from memory cells having the lowest target threshold voltage to memory cells having the highest target threshold voltage through the one-shot program operation. Therefore, when the program operation for the word line is completed on the threshold voltage states up to the 11th program state P11, a read operation may be successfully performed on the LSB page corresponding to the word line.

In the example of FIG. 13, the 1st logical page may be set to the 1st bit page, the 2nd logical page may be set to the 2nd bit page, the 3rd logical page may be set to the 3rd bit page, and the 4th logical page may be set to the 4th bit page, which is the order in which the logical pages are completely programmed.

Therefore, the memory system 110 in accordance with the present embodiment may perform the operation described with reference to FIG. 9, regardless of the amount of data which can be stored in one memory cell. That is, the memory system 110 may perform a read operation on logical pages corresponding to the last programmed word line in the order that the logical pages are completely programmed, during the sudden power-off recovery operation. When error correction on the first programmed logical page failed, the memory system 110 may not perform a read operation on the next logical page.

Figure 14:
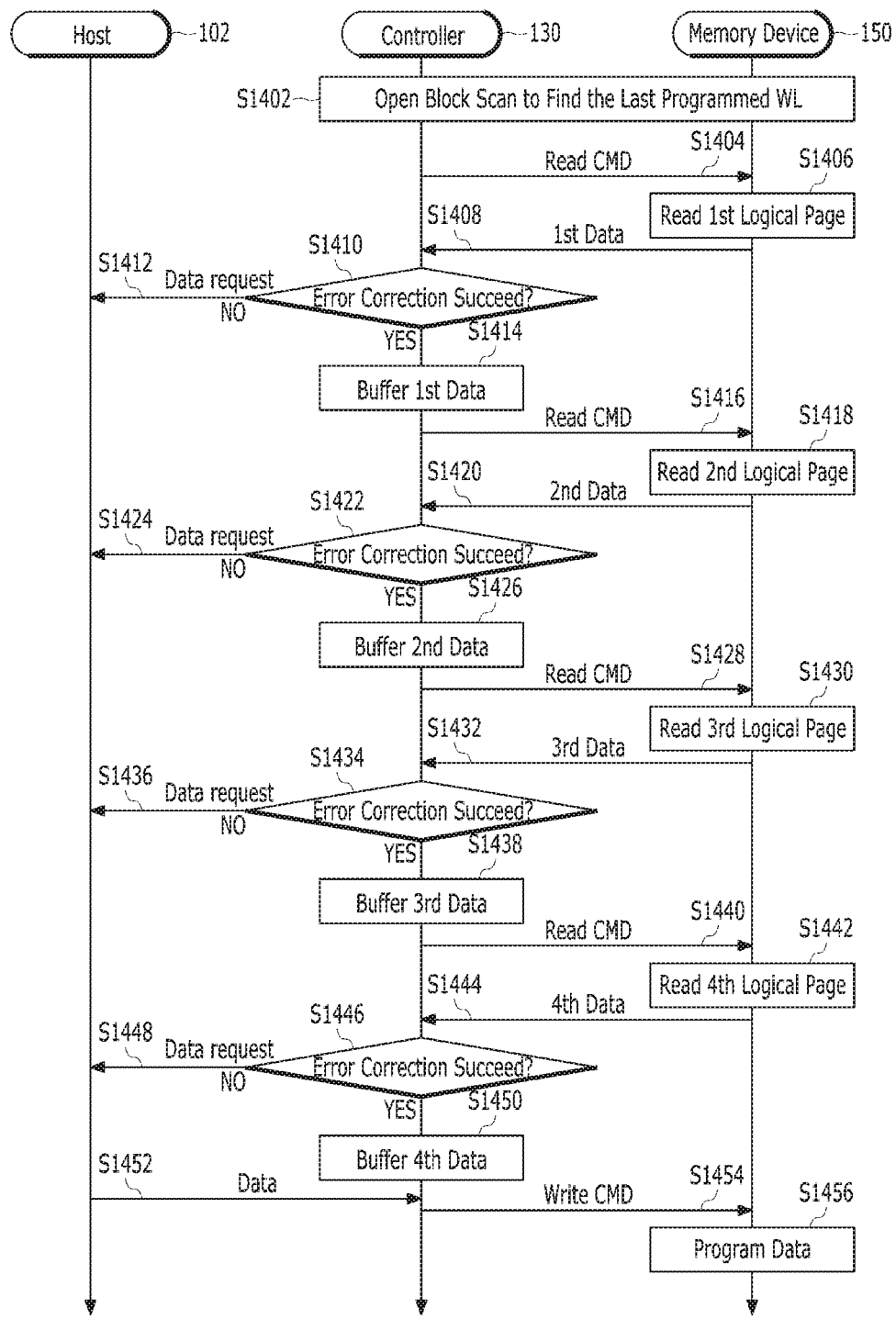
FIG. 14 is a flowchart illustrating a sudden power-off recovery operation of a memory system in accordance with an embodiment.

FIG. 14 is a flowchart illustrating the sudden power-off recovery operation of a memory system, e.g., the memory system 110 of FIG. 1, in accordance with the present embodiment. Specifically, FIG. 14 illustrates an example of the present embodiment, which is applied to the memory system 100 including the memory device 150 having a quadruple level cell or quad-level cell (QLC).

Steps S1402 to S1438 may correspond to steps S1202 to S1238 of FIG. 12, respectively.

That is, the memory system 110 may perform an open memory block scan operation to search for and find the last programmed word line at step S1402. The memory system 110 may perform a read operation on a plurality of logical pages corresponding to the last programmed word line in the order that the logical pages are completely programmed, that is, in order of the 1st logical page to the 4th logical page.

When the ECC component 138 failed in the error correction on the 1st data ("NO" at step S1410), the processor 134 may not perform steps S1414 to S1450. Instead, the processor 134 may request from the host 102 data to be programmed to a memory region corresponding to the last programmed word line at step S1412.

At step S1452, the host 102 may provide the data to the processor 134 through the memory interface 142 in response to the request of step S1412. The processor 134 may buffer the data provided from the host in the memory 144.

When the ECC component 138 failed in the error correction on the 2nd data ("NO" at step S1422), the processor 134 may not perform steps S1426 to S1450. Instead, the processor 134 may request from the host 102 data excluding the 1st data, among the data to be programmed to the memory region corresponding to the last programmed word line, at step S1424.

At step S1452, the host 102 may provide the data to the processor 134 through the memory interface 142 in response to the request of step S1424. The processor 134 may buffer the data provided from the host in the memory 144 with the 1st data buffered at step S1414.

When the ECC component 138 failed in the error correction on the 3rd data ("NO" at step S1434), the processor 134 may not perform steps S1438 to S1450. Instead, the processor 134 may request from the host 102 data excluding the 1st and 2nd data, among the data to be programmed to the memory region corresponding to the last programmed word line, at step S1436.

At step S1452, the host 102 may provide the data to the processor 134 through the memory interface 142 in response to the request of step S1436. The processor 134 may buffer the data provided from the host in the memory 144 with the 1st and 2nd data buffered at step S1414 and S1426.

When the ECC component 138 succeeded in the error correction on the 3rd data ("YES" at step S1434), the processor 134 may buffer the 3rd data in the memory 144 at step S1438.

At step S1440, the processor 134 may provide a read command to the memory device 150 to perform a read operation on the 4th logical page among the plurality of logical pages.

At step S1442, the memory device 150 may perform a read operation on the 4th logical page in response to the read command.

At step S1444, the memory device 150 may read the 4th data stored in the 4th logical page to the controller 130 through the memory interface 142.

At step S1446, the ECC component 138 may perform error detection and correction on the read 4th data.

When the ECC component 138 succeeded in the error correction ("YES" at step S1446), the processor 134 may buffer the corrected 4th data in the memory 144 at step S1450.

When the ECC component 138 failed in the error correction ("NO" at step S1446), the processor 134 may request from the host 102 data excluding the 1st to 3rd data, among the data to be programmed to the memory region corresponding to the last programmed word line, at step S1448.

At step S1452, the host 102 may provide the data to the processor 134 through the memory interface 142 in response to the request of step S1448. The processor 134 may buffer the data provided from the host in the memory 144 with the 1st to 3rd data buffered at steps S1414, S1426 and S1438.

At step S1454, the processor 134 may provide a write command to the memory device 150 to program the buffered data to another region.

At step S1456, the memory device 150 may program the buffered data in response to the write command.

In accordance with the present embodiment, the memory system 110 may not perform useless error correction during the sudden power-off recovery operation, thereby reducing the entire sudden power-off time.

FIGS. 15 to 23 are diagrams schematically illustrating application examples of the data processing system of FIGS. 1 to 14 according to various embodiments.

Figure 15:
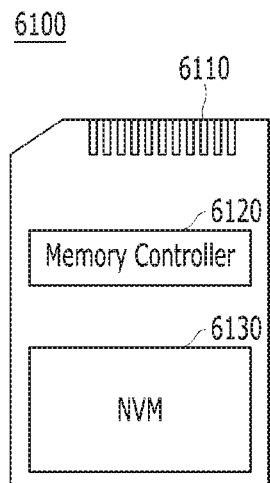
FIGS. 15 to 23 are diagrams schematically illustrating application examples of a data processing system in accordance with various embodiments of the present invention.

FIG. 15 is a diagram schematically illustrating a data processing system including a memory system in accordance with an embodiment. In particular, FIG. 15 schematically illustrates a memory card system 6100 to which the memory system in accordance with an embodiment is applied.

Referring to FIG. 15, the memory card system 6100 may include a memory controller 6120, a memory device 6130 and a connector 6110.

More specifically, the memory controller 6120 may be connected to the memory device 6130 embodied by a nonvolatile memory (NVM), and configured to access the memory device 6130. For example, the memory controller 6120 may be configured to control read, write, erase and background operations of the memory device 6130. The memory controller 6120 may be configured to provide an interface between the memory device 6130 and a host (not shown), and drive firmware for controlling the memory device 6130. That is, the memory controller 6120 may correspond to the controller 130 of the memory system 110 described with reference to FIG. 1, and the memory device 6130 may correspond to the memory device 150 of the memory system 110 described with reference to FIG. 1.

Thus, as shown in FIG. 1, the memory controller 6120 may include a random access memory (RAM), a processor, a host interface, a memory interface and an error correction component.

The memory controller 6120 may communicate with an external device, for example the host 102 of FIG. 1, through the connector 6110. For example, as described with reference to FIG. 1, the memory controller 6120 may be configured to communicate with an external device through one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), wireless fidelity (Wi-Fi or WiFi) and Bluetooth. Thus, the memory system and the data processing system may be applied to wired and/or wireless electronic devices, particularly mobile electronic devices.

The memory device 6130 may be implemented by a nonvolatile memory (NVM). For example, the memory device 6130 may be implemented by any of various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM), The memory controller 6120 and the memory device 6130 may be integrated into a single semiconductor device. For example, the memory controller 6120 and the memory device 6130 may be integrated to form a solid-state driver (SSD). Also, the memory controller 6120 and the memory device 6130 may form a memory card such as a PC card (e.g., Personal Computer Memory Card International Association (PCMCIA)), a compact flash (CF) card, a smart media card (e.g., SM and SMC), a memory stick, a multimedia card (e.g., MMC, RS-MMC, MMCmicro and eMMC), an secured digital (SD) card (e.g., SD, miniSD, microSD and SDHC) and/or a universal flash storage (UFS).

Figure 16:
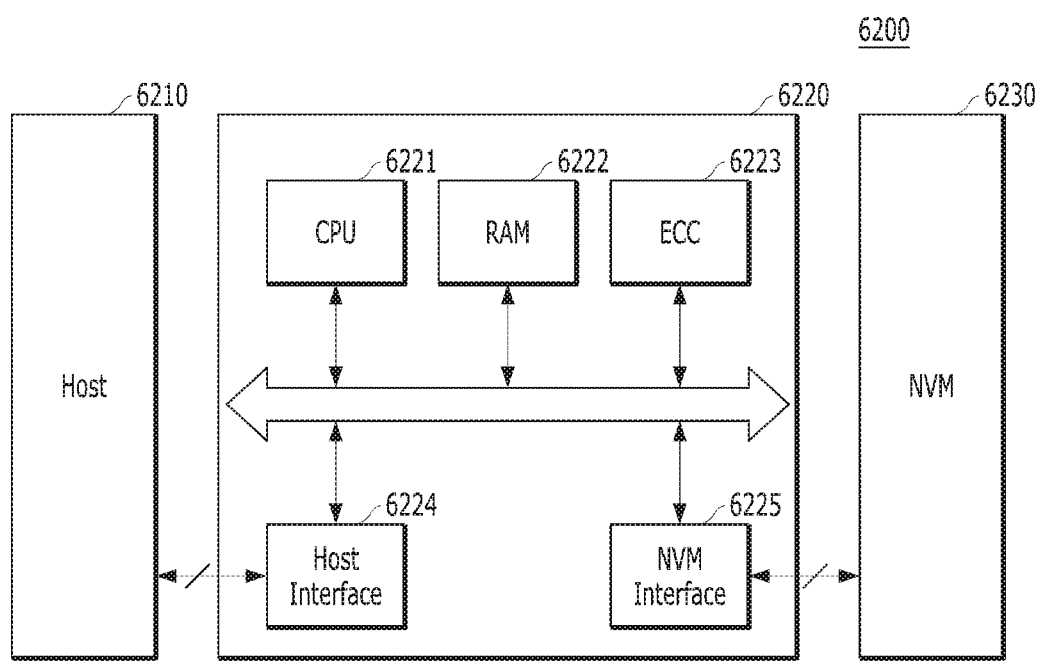

FIG. 16 is a diagram schematically illustrating another example of a data processing system 6200 including a memory system in accordance with an embodiment.

Referring to FIG. 16, the data processing system 6200 may include a memory device 6230 having one or more nonvolatile memories (NVMs) and a memory controller 6220 for controlling the Is memory device 6230. The data processing system 6200 may serve as a storage medium such as a memory card (e.g., CF, SD, micro-SD or the like) or USB device, as described with reference to FIG. 1. The memory device 6230 may correspond to the memory device 150 in the memory system 110 illustrated in FIG. 1, and the memory controller 6220 may correspond to the controller 130 in the memory system 110 illustrated in FIG. 1.

The memory controller 6220 may control a read, write or erase operation on the memory device 6230 in response to a request of the host 6210, and the memory controller 6220 may include one or more central processing units (CPUs) 6221, a buffer memory such as a random access memory (RAM) 6222, an error correction code (ECC) circuit 6223, a host interface 6224 and a memory interface such as an NVM interface 6225.

The CPU 6221 may control overall operations on the memory device 6230, for example, read, write, file system management and bad page management operations. The RAM 6222 may be operated according to control of the CPU 6221, and used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or transmitted to the host 6210 from the memory device 6230. When the RAM 6222 is used as a cache memory, the RAM 6222 may assist the memory device 6230 to operate at high speed.

The ECC circuit 6223 may correspond to the ECC component 138 of the controller 130 illustrated in FIG. 1. As described with reference to FIG. 1, the ECC circuit 6223 may generate an error correction code (ECC) for correcting a fail bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. The ECC circuit 6223 may correct an error using the parity bit. For example, as described with reference to FIG. 1, the ECC circuit 6223 may correct an error using Low Density Parity Check (LDPC) code, Bose-Chaudhri-Hocquenghem (BCH) code, turbo code, Reed-Solomon code, convolution code, Recursive Systematic Code (RSC) or coded modulation such as Trellis-Coded Modulation (TCM) or Block coded modulation (BCM).

The memory controller 6220 may exchange data with the host 6210 through the host interface 6224, and exchange data with the memory device 6230 through the NVM interface 6225. The host interface 6224 may be connected to the host 6210 through a parallel advanced technology attachment (PATA) bus, serial advanced technology attachment (SATA) bus, small computer system interface (SCSI), universal serial bus (USB), peripheral component interconnect-express (PCIe) or NAND interface. The memory controller 6220 may have a wireless communication function with a mobile communication protocol such as wireless fidelity (WiFi) or Long Term Evolution (LTE). The memory controller 6220 may be connected to an external device, for example, the host 6210 or another external device, and then transmit and/or receive data to and/or from the external device. In particular, as the memory controller 6220 is configured to communicate with the external device through one or more of various communication protocols, the memory system and the data processing system may be applied to wired and/or wireless electronic devices, particularly a mobile electronic device.

Figure 17:
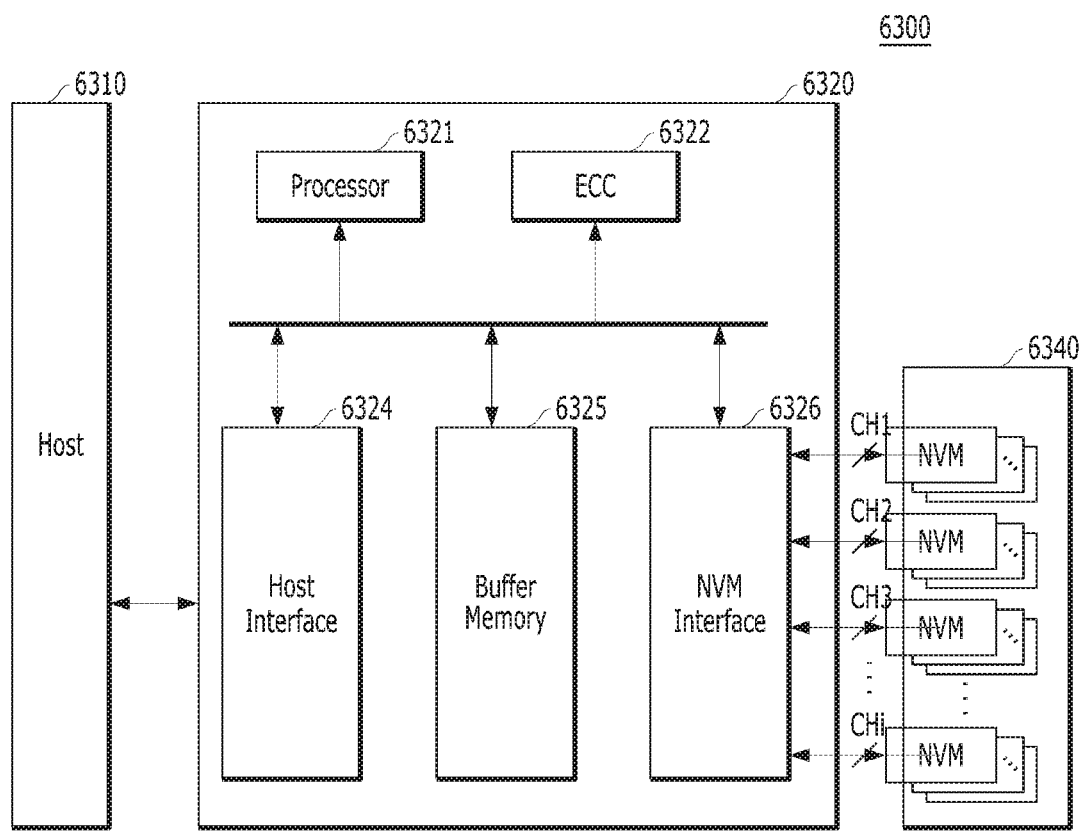

FIG. 17 is a diagram schematically illustrating another example of a data processing system including a memory system in accordance with an embodiment. In particular, FIG. 17 schematically illustrates a solid state drive (SSD) 6300 to which the memory system may be applied.

Referring to FIG. 17, the SSD 6300 may include a controller 6320 and a memory device 6340 including a plurality of nonvolatile memories (NVMs). The controller 6320 may correspond to the controller 130 in the memory system 110 of FIG. 1, and the memory device 6340 may correspond to the memory device 150 in the memory system of FIG. 1.

More specifically, the controller 6320 may be connected to the memory device 6340 through a plurality of channels CH1 to CHi. The controller 6320 may include one or more processors 6321, an error correction code (ECC) circuit 6322, a host interface 6324, a buffer memory 6325 and a memory interface, for example, a nonvolatile memory interface 6326.

The buffer memory 6325 may temporarily store data provided from the host 6310 or data provided from a plurality of flash memories NVM included in the memory device 6340, or temporarily store meta data of the plurality of flash memories NVM, for example, map data including a mapping table. The buffer memory 6325 may be embodied by volatile memories such as dynamic random access memory (DRAM), synchronous DRAM (SDRAM), double data rate (DDR) SDRAM, low power DDR (LPDDR) SDRAM and graphics RAM (GRAM) or nonvolatile memories such as ferroelectric RAM (FRAM), resistive RAM (RRAM or ReRAM), spin-transfer torque magnetic RAM (STT-MRAM) and phase-change RAM (PRAM). By way of example, FIG. 17 illustrates that the buffer memory 6325 exists in the controller 6320. However, the buffer memory 6325 may be disposed externally to the controller 6320.

The ECC circuit 6322 may calculate an error correction code (ECC) value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110 of FIG. 1 is applied may be provided to embody a data processing system, for example, a redundant array of independent disks (RAID) system. The RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, that is, RAID level information of the write command provided from the host 6310 in the SSDs 6300, and output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300, and provide data read from the selected SSDs 6300 to the host 6310.

Figure 18:
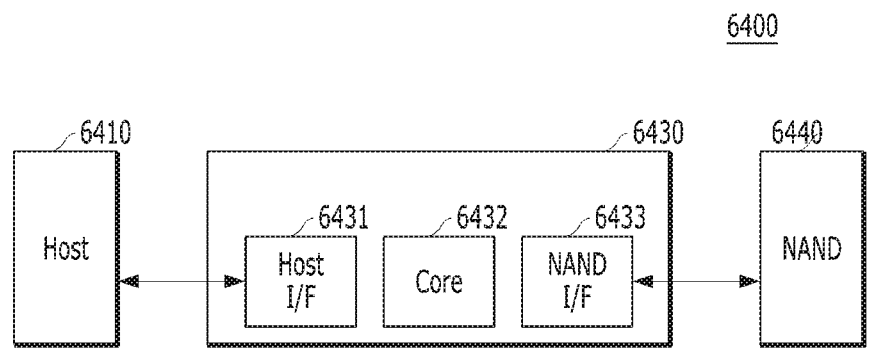

FIG. 18 is a diagram illustrating another example of a data processing system including a memory system in accordance with an embodiment. For example, FIG. 18 illustrates an embedded Multi-Media Card (eMMC) 6400 to which the memory system may be applied.

Referring to FIG. 18, the eMMC 6400 may include a controller 6430 and a memory device 6440 embodied by one or more NAND flash memories. The controller 6430 may correspond to the controller 130 in the memory system 110 of FIG. 1, and the memory device 6440 may correspond to the memory device 150 in the memory system 110 of FIG. 1.

More specifically, the controller 6430 may be connected to the memory device 6440 through a plurality of channels. The controller 6430 may include one or more cores 6432, a host interface (I/F) 6431 and a memory interface, for example, a NAND interface (I/F) 6433.

The core 6432 may control overall operations of the eMMC 6400, the host interface 6431 may provide an interface function between the controller 6430 and the host 6410, and the NAND interface 6433 may provide an interface function between the memory device 6440 and the controller 6430. For example, the host interface 6431 may serve as a parallel interface, for example, MMC interface as described with reference to FIG. 1. Furthermore, the host interface 6431 may serve as a serial interface, for example, Ultra High Speed (UHS)-I and UHS-II interface.

Each of the memory controller 6120, the memory controller 6220, the controller 6320 and the controller 6430, which have been described with reference to FIGS. 15 to 18, may include a processor, an ECC component and a memory. Each of the memory controller 6120, the memory controller 6220, the controller 6320 and the controller 6430 may control the sequential read operations of the memory device on the plurality of logical pages corresponding to the last programmed word line during the sudden power-off recovery operation, and end the sequential read operations on the plurality of logical pages depending on whether error correction on sequentially read data fails. Therefore, the memory system may not perform useless read and error correction operations on a logical page where program completion is difficult to expect, thereby reducing the time required for the sudden power-off recovery operation.

FIGS. 19 to 22 are diagrams illustrating other examples of a data processing system including a memory system in accordance with one or more embodiments. For example, FIGS. 19 to 22 illustrate universal flash storage (UFS) systems to which the memory system may be applied. The memory systems in accordance with the various embodiments described with reference to FIGS. 1 to 18 can be applied to the universal flash storage (UFS) described with reference to FIGS. 19 to 22.

Referring to FIGS. 19 to 22, the UFS systems 6500, 6600, 6700 and 6800 may include hosts 6510, 6610, 6710 and 6810, UFS devices 6520, 6620, 6720 and 6820 and UFS cards 6530, 6630, 6730 and 6830, respectively. The hosts 6510, 6610, 6710 and 6810 may serve as application processors of wired and/or wireless electronic devices, particularly mobile electronic devices, the UFS devices 6520, 6620, 6720 and 6820 may serve as embedded UFS devices. The UFS cards 6530, 6630, 6730 and 6830 may serve as external embedded UFS devices or removable UFS cards.

The hosts 6510, 6610, 6710 and 6810, the UFS devices 6520, 6620, 6720 and 6820 and the UFS cards 6530, 6630, 6730 and 6830 in the respective UFS systems 6500, 6600, 6700 and 6800 may communicate with external devices, for example, wired and/or wireless electronic devices, particularly mobile electronic devices, through UFS protocols. The UFS devices 6520, 6620, 6720 and 6820 and the UFS cards 6530, 6630, 6730 and 6830 may be embodied by the memory system 110 illustrated in FIG. 1. For example, in the UFS systems 6500, 6600, 6700 and 6800, the UFS devices 6520, 6620, 6720 and 6820 may be embodied in the form of the data processing system 6200, the SSD 6300 or the eMMC 6400 described with reference to FIGS. 16 to 18, and the UFS cards 6530, 6630, 6730 and 6830 may be embodied in the form of the memory card system 6100 described with reference to FIG. 15.

Furthermore, in the UFS systems 6500, 6600, 6700 and 6800, the hosts 6510, 6610, 6710 and 6810, the UFS devices 6520, 6620, 6720 and 6820 and the UFS cards 6530, 6630, 6730 and 6830 may communicate with each other through an UFS interface, for example, MIPI M-PHY and MIPI UniPro (Unified Protocol) in MIPI (Mobile Industry Processor Interface). Furthermore, the UFS devices 6520, 6620, 6720 and 6820 and the UFS cards 6530, 6630, 6730 and 6830 may communicate with each other through various protocols other than the UFS protocol, for example, universal storage bus (USB) Flash Drives (UFDs), multi-media card (MMC), secure digital (SD), mini-SD, and micro-SD.

Figure 19:
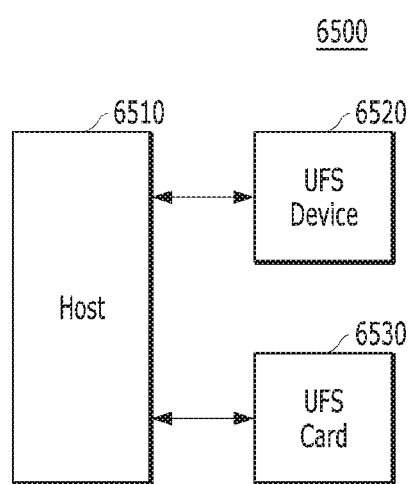

In the UFS system 6500 illustrated in FIG. 19, each of the host 6510, the UFS device 6520 and the UFS card 6530 may include UniPro. The host 6510 may perform a switching operation in order to communicate with the UFS device 6520 and the UFS card 6530. In particular, the host 6510 may communicate with the UFS device 6520 or the UFS card 6530 through link layer switching, for example, L3 switching at the UniPro. The UFS device 6520 and the UFS card 6530 may communicate with each other through link layer switching at the UniPro of the host 6510. In the embodiment of FIG. 19, the configuration in which one UFS device 6520 and one UFS card 6530 are connected to the host 6510 is illustrated by way of example. However, in another embodiment, a plurality of UFS devices and UFS cards may be connected in parallel or in the form of a star to the host 6510, and a plurality of UFS cards may be connected in parallel or in the form of a star to the UFS device 6520 or connected in series or in the form of a chain to the UFS device 6520.

Figure 20:
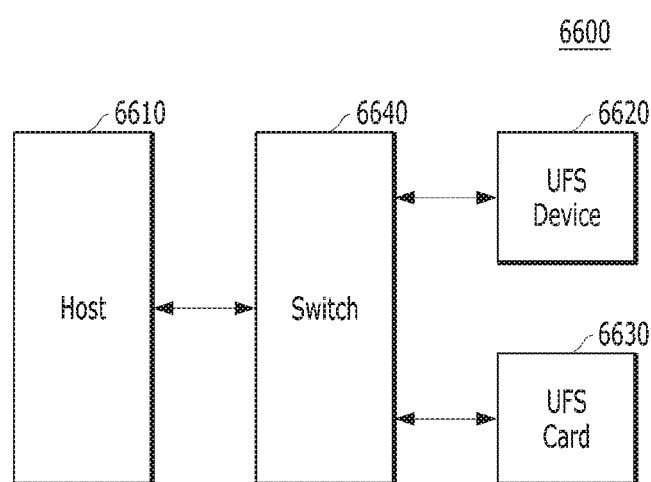

In the UFS system 6600 illustrated in FIG. 20, each of the host 6610, the UFS device 6620 and the UFS card 6630 may include UniPro, and the host 6610 may communicate with the UFS device 6620 or the UFS card 6630 through a switching module 6640 performing a switching operation, for example, through the switching module 6640 which performs link layer switching at the UniPro, for example, L3 switching. The UFS device 6620 and the UFS card 6630 may communicate with each other through link layer switching of the switching module 6640 at UniPro. In the embodiment of FIG. 20, the configuration in which one UFS device 6620 and one UFS card 6630 are connected to the switching module 6640 is illustrated by way of example. However, in another embodiment, a plurality of UFS devices and UFS cards may be connected in parallel or in the form of a star to the switching module 6640, and a plurality of UFS cards may be connected in series or in the form of a chain to the UFS device 6620.

Figure 21:
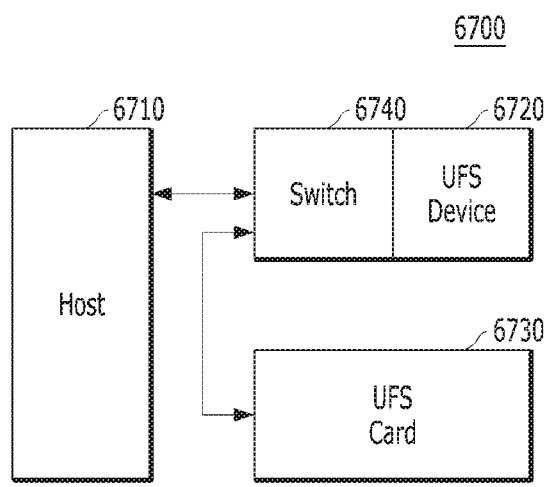

In the UFS system 6700 illustrated in FIG. 21, each of the host 6710, the UFS device 6720 and the UFS card 6730 may include UniPro. The host 6710 may communicate with the UFS device 6720 or the UFS card 6730 through a switching module 6740 performing a switching operation, for example, through the switching module 6740 which performs link layer switching at the UniPro, for example, L3 switching. The UFS device 6720 and the UFS card 6730 may communicate with each other through link layer switching of the switching module 6740 at the UniPro, and the switching module 6740 may be integrated as one module with the UFS device 6720 within or externally to the UFS device 6720. In the embodiment of FIG. 21, the configuration in which one UFS device 6720 and one UFS card 6730 are connected to the switching module 6740 is illustrated by way of example. However, in another embodiment, a plurality of modules each including the switching module 6740 and the UFS device 6720 may be connected in parallel or in the form of a star to the host 6710 or connected in series or in the form of a chain to each other. Furthermore, a plurality of UFS cards may be connected in parallel or in the form of a star to the UFS device 6720.

Figure 22:
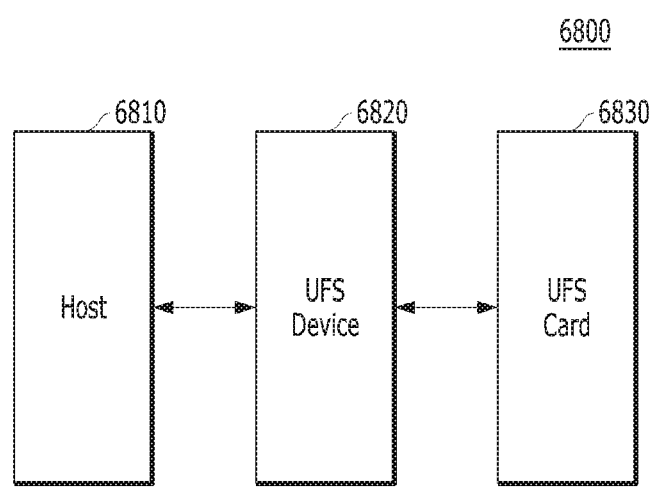

In the UFS system 6800 illustrated in FIG. 22, each of the host 6810, the UFS device 6820 and the UFS card 6830 may include M-PHY and UniPro. The UFS device 6820 may perform a switching operation in order to communicate with the host 6810 and the UFS card 6830. In particular, the UFS device 6820 may communicate with the host 6810 or the UFS card 6830 through a switching operation between the M-PHY and UniPro module for communication with the host 6810 and the M-PHY and UniPro module for communication with the UFS card 6830, for example, through a target Identifier (ID) switching operation. The host 6810 and the UFS card 6830 may communicate with each other through target ID switching between the M-PHY and UniPro modules of the UFS device 6820. In the embodiment of FIG. 22, the configuration in which one UFS device 6820 is connected to the host 6810 and one UFS card 6830 is connected to the UFS device 6820 is illustrated by way of example. However, in another embodiment, a plurality of UFS devices may be connected in parallel or in the form of a star to the host 6810, or connected in series or in the form of a chain to the host 6810, and a plurality of UFS cards may be connected in parallel or in the form of a star to the UFS device 6820, or connected in series or in the form of a chain to the UFS device 6820.

Figure 23:
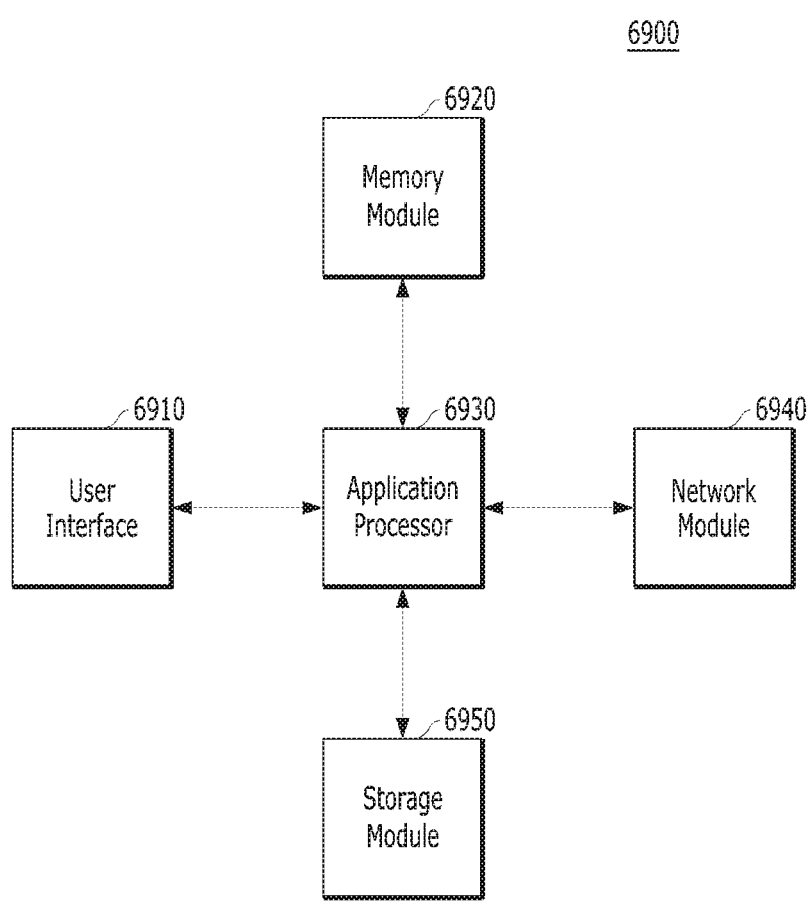

FIG. 23 is a diagram illustrating a data processing system including the memory system in accordance with an embodiment. For example, FIG. 23 is a diagram illustrating a user system 6900 to which the memory system may be applied.

Referring to FIG. 23, the user system 6900 may include a user interface 6910, a memory module 6920, an application processor 6930, a network module 6940, and a storage module 6950.

More specifically, the application processor 6930 may drive components included in the user system 6900, for example, an operating system (OS), and include controllers, interfaces and a graphic engine which control the components included in the user system 6900. The application processor 6930 may be provided as System-on-Chip (SoC).

The memory module 6920 may be used as a main memory, work memory, buffer memory or cache memory of the user system 6900. The memory module 6920 may include a volatile random access memory (RAM) such as a dynamic RAM (DRAM), a synchronous DRAM (SDRAM), a double data rate (DDR) SDRAM, DDR2 SDRAM, DDR3 SDRAM, LPDDR SDARM, LPDDR3 SDRAM or LPDDR3 SDRAM or a nonvolatile RAM such as a phase-change RAM (PRAM), a resistive RAM (ReRAM), a magneto-resistive RAM (MRAM) or a ferroelectric RAM (FRAM). For example, the application processor 6930 and the memory module 6920 may be packaged and mounted, based on Package on Package (PoP).

The network module 6940 may communicate with external devices. For example, the network module 6940 may not only support wired communication, but also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (WiMAX), wireless local area network (WLAN), ultra-wideband (UWB), Bluetooth, wireless display (WI-DI), thereby communicating with wired and/or wireless electronic devices, particularly mobile electronic devices. Therefore, the memory system and the data processing system, in accordance with an embodiment of the present invention, can be applied to wired and/or wireless electronic devices. The network module 6940 may be included in the application processor 6930.

The storage module 6950 may store data, for example, data received from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, NOR flash and 3D NAND flash, and provided as a removable storage medium such as a memory card or external drive of the user system 6900. The storage module 6950 may correspond to the memory system 110 described with reference to FIG. 1. Furthermore, the storage module 6950 may be embodied as an SSD, eMMC and UFS as described above with reference to FIGS. 17 to 22.

In an embodiment, the storage module 6950 may include a device which controls sequential read operations of the memory device on a plurality of logical pages corresponding to the last programmed word line during a sudden power-off recovery operation, and ends the sequential read operations on the plurality of logical pages depending on whether error correction on sequentially read data fails, in order to reduce the time required for the sudden power-off recovery operation.

The user interface 6910 may include interfaces for inputting data or commands to the application processor 6930 or outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, an LED, a speaker and a motor.

Furthermore, when the memory system 110 of FIG. 1 is applied to a mobile electronic device of the user system 6900, the application processor 6930 may control overall operations of the mobile electronic device, and the network module 6940 may serve as a communication module for controlling wired and/or wireless communication with an external device. The user interface 6910 may display data processed by the processor 6930 on a display/touch module of the mobile electronic device, or support a function of receiving data from the touch panel.

In accordance with embodiments, a memory system capable of reducing the time required for a recovery operation due to a sudden power-off, and an operation method thereof, are provided.

Although various embodiments have been illustrated and described, it will be apparent to those skilled in the art in light of the present disclosure that various changes and modifications may be made without departing from the spirit and scope of the invention as defined in the following claims.

What is claimed is:

1. A memory system comprising:
a multi-level cell memory device; and
a controller suitable for controlling the memory device,
wherein the controller comprises a processor suitable for searching for the last programmed word line in an open memory block when the memory system is powered up after a sudden power-off, and controlling sequential read operations by controlling the memory device to perform read operations on the data in a plurality of logical pages corresponding to the last programmed word line in the order in which the plurality of logical pages are programmed through a one-shot program operation,
wherein the processor stops the sequential read operations depending on whether error correction on sequentially read data fails, receives from a host, normal data corresponding to the error correction-failed data and data on which the sequential read operations are not performed, and controls the memory device to program the received data.

2. The memory system of claim 1, wherein the controller further comprises an error correction code (ECC) component suitable for performing the error correction on the sequentially read data.

3. The memory system of claim 1, wherein the controller further comprises a memory suitable for temporarily storing the data received from the host.

4. The memory system of claim 3, wherein the processor temporarily stores the corrected data in the memory, and controls the memory device to program the data stored in the memory thereto.

5. The memory system of claim 1, wherein the order that the plurality of logical pages are programmed through the one-shot program operation is determined according to mapping between a plurality of threshold voltage states of memory cells and gray codes.

6. The memory system of claim 1, wherein the order that the plurality of logical pages are programmed through the one-shot program operation is determined according to ascending order of read voltages for reading the respective logical pages.

7. The memory system of claim 2, wherein the processor controls a read operation on data of the memory device, corresponding to a first logical page among the plurality of logical pages,
the ECC component performs error correction on first data of the memory device corresponding to the first logical page, and
the processor receives data corresponding to the plurality of logical pages from the host depending on whether the error correction on the first data fails, and controls the memory device to program the received data thereto.

8. The memory system of claim 7, wherein the first logical page comprises a logical page, corresponding to data first stored by a one-shot program operation.

9. An operation method of a multi-level cell memory system having a memory device and a controller, the method comprising:
searching for the last programmed word line in an open memory block, when the memory system is powered up after a sudden power-off;
performing sequential read operations by performing read operations on data in the plurality of logical pages corresponding to the last programmed word line in the order that the plurality of logical pages are programmed through a one-shot program operation;
stopping the sequential read operations on the data corresponding to the plurality of logical pages depending on whether error correction on sequentially read data fails, and receiving from a host, normal data corresponding to the error correction-failed data and data on which the sequential read operations are not performed; and
programming the received data to the memory device.

10. The operation method of claim 9, further comprising performing the error correction on the sequentially read data.

11. The operation method of claim 10, wherein the performing of the error correction on the sequentially read data is performed through one or more techniques of hard decision, soft decision and chipkill.

12. The operation method of claim 9, further comprising temporarily storing the data received from the host in a memory of the controller.

13. The operation method of claim 12, further comprising:
temporarily storing the corrected data in the memory; and
controlling the memory device to program the data stored in the memory thereto.

14. The operation method of claim 9, wherein the order that the plurality of logical pages are programmed through the one-shot program operation is determined according to mapping between a plurality of threshold voltage states of memory cells and gray codes.

15. The operation method of claim 9, wherein the order that the plurality of logical pages are programmed through the one-short program operation is determined according to ascending order of read voltages for reading the respective logical pages.

16. The operation method of claim 10, wherein the performing of the sequential read operations comprises performing a read operation on data of the memory device corresponding to a first logical page among the plurality of logical pages, and
the stopping of the sequential read operations on the data corresponding to the plurality of logical pages depending on whether the error correction on the sequentially read data fails, and the receiving of the error correction-failed data and the data on which the sequential read operations are not performed comprises stopping the sequential read operations on the plurality of logical pages depending on whether error correction on the first data fails, and receiving data corresponding to the plurality of logical pages from the host.

17. The operation method of claim 16, wherein the first logical page comprises a logical page, corresponding to data first stored by a one-shot program operation.

18. A memory system comprising:
a memory device including a plurality of multi-level cells coupled between a plurality of word lines and a plurality of bit lines; and
a controller suitable for:
searching for a last programmed word line among the plurality of word lines when the memory system is powered up after a sudden power-off, the last programmed word line corresponding to a plurality of logical pages;

performing a recovering operation for a first logical page among the plurality of logical pages;

when the recovering of the first logical page failed due to error correction on sequentially read data in the first logical page failing, stopping a recovering operation for a second logical page, receiving from a host, normal data corresponding to the error correction-failed data and data on which the sequential read operations are not performed, and controlling the memory device to program the received data; and when the recovering of the first logical page succeeded, performing sequential read operations on data in the plurality of logical pages corresponding to the last programmed word line in the order in which the plurality of logical pages are programmed through a one-shot program operation.

* * * * *